(12) United States Patent
Kim et al.

(10) Patent No.: US 12,164,735 B2
(45) Date of Patent: Dec. 10, 2024

(54) INPUT SENSING PART AND DISPLAY DEVICE INCLUDING THE SAME

(71) Applicant: SAMSUNG DISPLAY CO., LTD., Yongin-si (KR)

(72) Inventors: Hyungbae Kim, Yongin-si (KR); Hyun-Wook Cho, Yongin-si (KR); Sangkook Kim, Yongin-si (KR); Taejoon Kim, Gyeonggi-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/156,928

(22) Filed: Jan. 19, 2023

(65) Prior Publication Data

US 2023/0325041 A1 Oct. 12, 2023

(30) Foreign Application Priority Data

Apr. 12, 2022 (KR) ........................ 10-2022-0045162

(51) Int. Cl.
*G09G 5/00* (2006.01)
*G06F 3/041* (2006.01)
*G06F 3/044* (2006.01)
*H10K 59/40* (2023.01)

(52) U.S. Cl.
CPC .......... *G06F 3/0446* (2019.05); *G06F 3/0412* (2013.01); *G06F 3/0443* (2019.05); *H10K 59/40* (2023.02); *G06F 2203/04111* (2013.01); *G06F 2203/04112* (2013.01)

(58) Field of Classification Search
CPC .... G06F 3/0446; G06F 3/0412; G06F 3/0443; G06F 2203/04111; G06F 2203/04112; G06F 3/0418; G06F 3/0445; G06F 3/04182; G06F 3/04164; G06F 3/0448; H10K 59/40; H01L 27/156
USPC ........................ 345/174, 173, 156, 157, 204
See application file for complete search history.

(56) References Cited

U.S. PATENT DOCUMENTS

| | | | |
|---|---|---|---|
| 11,182,005 B2 | 11/2021 | Kim et al. | |
| 11,275,473 B2 | 3/2022 | Bok et al. | |
| 2021/0005677 A1 | 1/2021 | Lee et al. | |
| 2021/0132720 A1* | 5/2021 | Lee | H10K 59/40 |
| 2021/0216737 A1* | 7/2021 | Kim | G06V 40/1306 |
| 2021/0318730 A1 | 10/2021 | Lee et al. | |
| 2021/0357082 A1* | 11/2021 | Yang | G06F 3/0443 |

(Continued)

FOREIGN PATENT DOCUMENTS

| | | |
|---|---|---|
| CN | 111123562 | 6/2020 |
| CN | 112181191 | 1/2021 |

(Continued)

*Primary Examiner* — Thuy N Pardo
(74) *Attorney, Agent, or Firm* — F. CHAU & ASSOCIATES, LLC

(57) ABSTRACT

An input sensing part includes a first sensing electrode, a second sensing electrode that is insulated from the first sensing electrode and crosses the first sensing electrode, a plurality of dummy electrodes that are disposed in dummy areas located between the first and second sensing electrodes, when viewed in a plan view, and a dummy connection pattern that is insulated from the first and second sensing electrodes. The dummy connection pattern crosses the first sensing electrode or the second sensing electrode, when viewed in a plan view, and connects the dummy electrodes.

20 Claims, 28 Drawing Sheets

(56) References Cited

U.S. PATENT DOCUMENTS

| | | | |
|---|---|---|---|
| 2022/0075486 A1* | 3/2022 | Choi | G06F 3/0443 |
| 2022/0077425 A1* | 3/2022 | Lee | H10K 59/873 |
| 2023/0161448 A1* | 5/2023 | Yang | G06F 3/0443 |
| | | | 345/173 |
| 2023/0422543 A1* | 12/2023 | Nam | G06F 1/1643 |

FOREIGN PATENT DOCUMENTS

| | | |
|---|---|---|
| CN | 108874210 | 4/2021 |
| KR | 10-1979891 | 5/2019 |
| KR | 10-2019-0108870 | 8/2019 |
| KR | 10-2020-0143628 | 12/2020 |
| KR | 10-2021-0003972 | 1/2021 |
| KR | 10-2021-0127831 | 10/2021 |

\* cited by examiner

INPUT SENSING PART AND DISPLAY DEVICE INCLUDING THE SAME

CROSS-REFERENCE TO RELATED APPLICATIONS

This application claims priority under 35 U.S.C. § 119 from Korean Patent Application No. 10-2022-0045162, filed on Apr. 12, 2022 in the Korean Intellectual Property Office, the contents of which are herein incorporated by reference in their entirety.

TECHNICAL FIELD

Embodiments of the present disclosure described herein are directed to an input sensing part and a display device that includes the same.

DISCUSSION OF THE RELATED ART

In general, an electronic device that provides images to a user, such as a smartphone, a digital camera, a notebook computer, a navigation system, or a smart television, includes a display device that displays images. The display device generates an image and provides the user with the generated image through a display screen.

A display device includes a display panel that generates an image and an input sensing part disposed on the display panel that can sense an external input. The input sensing part is disposed on the display panel and senses a user's touch as an external input. The input sensing part includes a plurality of sensing electrodes that sense an external input and sensing lines connected with the sensing electrodes. The sensing electrodes are disposed in an active area, and the sensing lines are disposed in an inactive area around the active area.

Driving signals are applied to the sensing electrodes, and a capacitance change of the sensing electrodes is output as a sensing signal. The driving signals are applied to the sensing electrodes through the sensing lines. When a driving signal with a given frequency is applied to a sensing electrode, an electromagnetic wave associated with the driving signal radiates as an unnecessary electromagnetic signal.

The electromagnetic signal acts as noise to other devices. For example, the electromagnetic signal can interfere with operations of other devices. This phenomenon is defined as an electromagnetic interference (EMI). A technology that reduces electromagnetic interference is desired.

SUMMARY

Embodiments of the present disclosure provide an input sensing part that decreases electromagnetic interference and a display device that includes the same.

According to an embodiment, an input sensing part includes a first sensing electrode, a second sensing electrode that is insulated from the first sensing electrode and crosses the first sensing electrode, a plurality of dummy electrodes that are disposed in dummy areas located between the first and second sensing electrodes, when viewed in a plan view, and a dummy connection pattern that is insulated from the first and second sensing electrodes. The dummy connection pattern crosses the first sensing electrode or the second sensing electrode, when viewed in a plan view, and connects the dummy electrodes.

According to an embodiment, an input sensing pan includes a first sensing electrode, a second sensing electrode that is insulated from the first sensing electrode and crosses the first sensing electrode, and a plurality of dummy electrodes that are disposed in dummy areas located between the first and second sensing electrodes and are connected with each other, when viewed in a plan view. A driving signal is applied to the first sensing electrode, and an offset signal is applied to the dummy electrodes. A phase of the offset signal is opposite to a phase of the driving signal.

According to an embodiment, a display device includes a display panel, and an input sensing part disposed on the display panel. The input sensing part includes a first sensing electrode, a second sensing electrode that is insulated from the first sensing electrode and crosses the first sensing electrode, a plurality of dummy electrodes that are disposed in dummy areas located between the first and second sensing electrodes, when viewed in a plan view, and a dummy connection pattern that is insulated from the first and second sensing electrodes. The dummy connection pattern crosses the first sensing electrode or the second sensing electrode, when viewed in a plan view, and connects the dummy electrodes.

DETAILED DESCRIPTION

Figure 1:
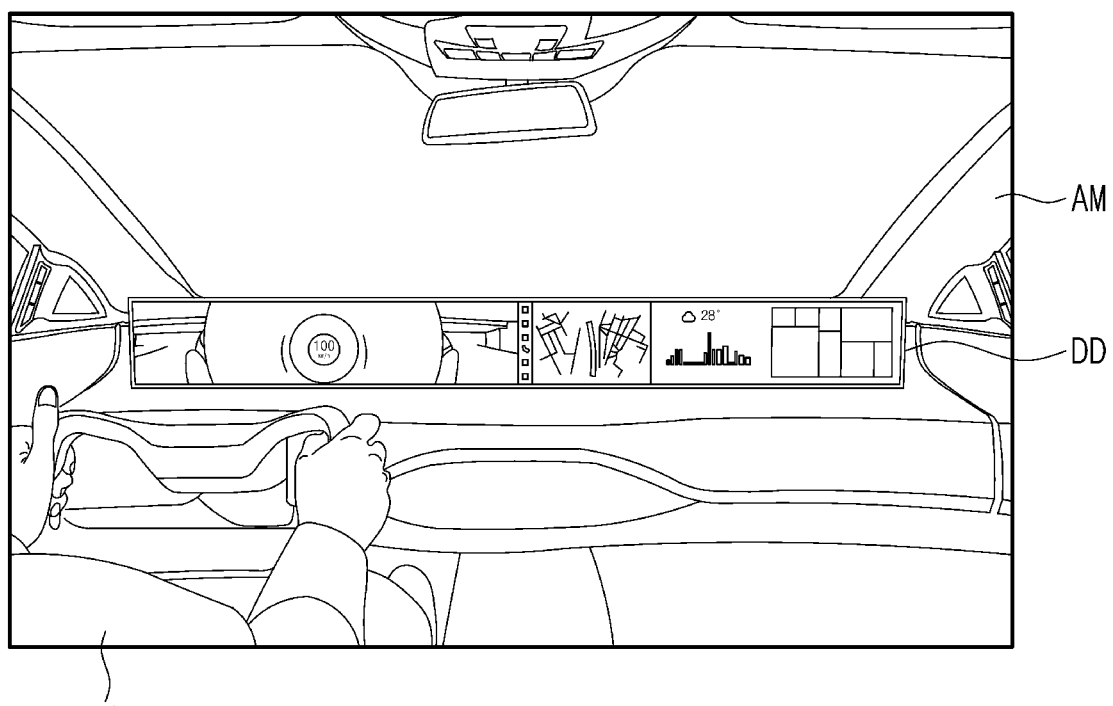
FIG. 1 illustrates the interior of a vehicle in which a display device according to an embodiment of the present disclosure is disposed.
Figure 1:
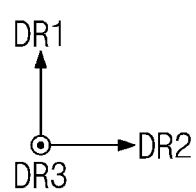

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals may refer to like components.

Below, embodiments of the present disclosure will be described with reference to accompanying drawings.

Figure 2:
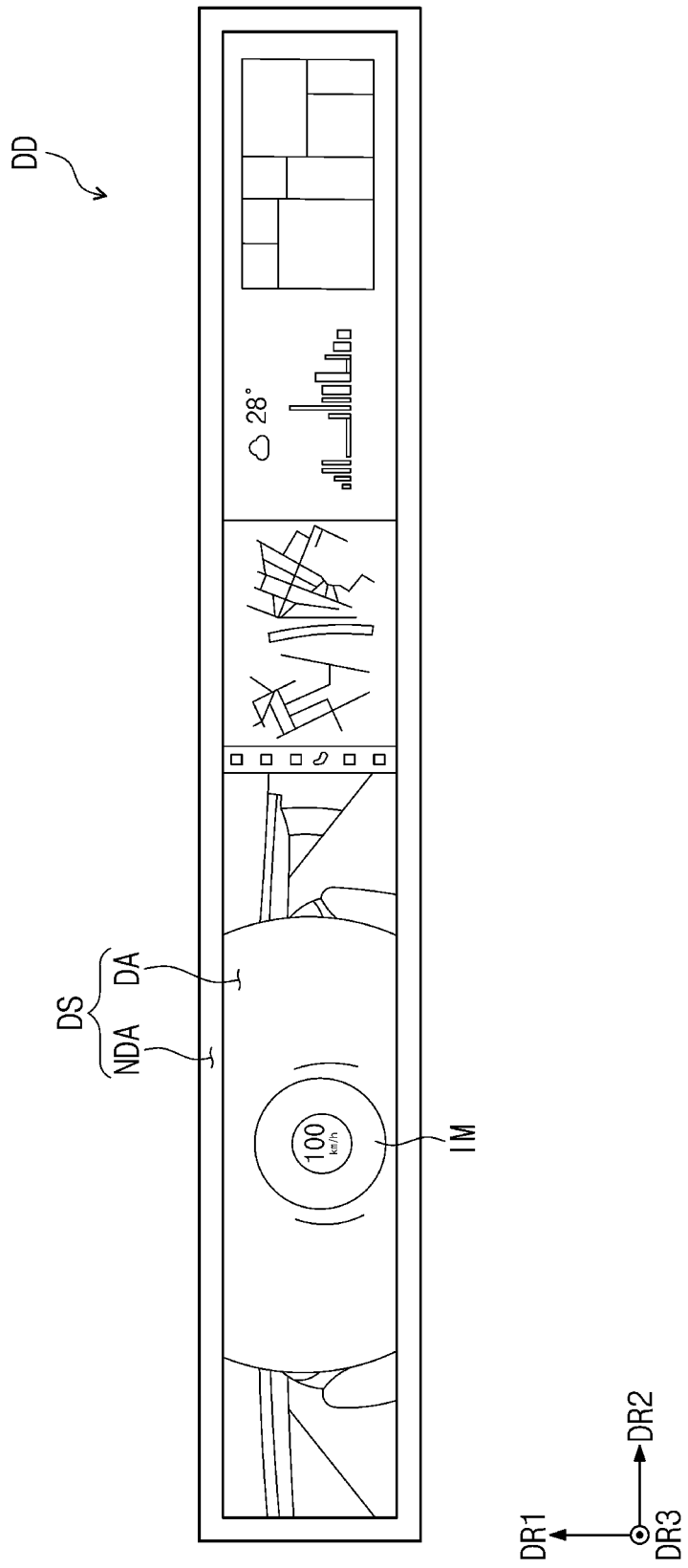
FIG. 2 is a plan view of a display device illustrated in FIG. 1.

FIG. 1 illustrates the interior of a vehicle in which a display device according to an embodiment of the present disclosure is disposed. FIG. 2 is a plan view of a display device illustrated in FIG. 1.

Referring to FIG. 1, in an embodiment, a display device DD is disposed within an automobile AM. The display device DD is disposed within the automobile AM and provides a driver US, hereinafter referred to as a "user", with a variety of information. The display device DD provides the user US with information such as a speed, weather, or a map. The display device DD may be a touch display that operates depending on a touch input of the user US.

Referring to FIGS. 1 and 2, the display device DD according to an embodiment of the present disclosure has a rectangular shape that has short sides (or edges) that extend in a first direction DR1 and long sides (or edges) that extend in a second direction DR2 that intersects the first direction DR1. However, embodiments of the present disclosure are not necessarily limited thereto. In some embodiments, the display device DD has various other shapes, such as a circle or a polygon.

Hereinafter, a direction that is substantially perpendicular to a plane defined by the first direction DR1 and the second direction DR2 is defined as a third direction DR3. In addition, in the specification, the expression "when viewed in a plan view" means a state of being viewed from the third direction DR3.

An upper surface of the display device DD, through which an image is provided to the user US, is defined as a display surface DS and is parallel to a plane defined by the first direction DR1 and the second direction DR2. Images IM generated by the display device DD are provided to the user US through the display surface DS. The display device DD can sense a touch of the user US.

The display surface DS includes a display area DA and a non-display area NDA around the display area DA. The display area DA displays an image, and the non-display area NDA does not display an image. The non-display area NDA is printed with a given color and surrounds the display area DA and forms a border of the display device DD.

The display device DD for an automobile is illustrated as an example, but embodiments of the present disclosure are not necessarily limited thereto. For example, the display device DD according to an embodiment of the present disclosure can be used in an electronic device that provides a user with an image, such as a smartphone, a digital camera, a notebook computer, a monitor, or a smart television.

Figure 3:
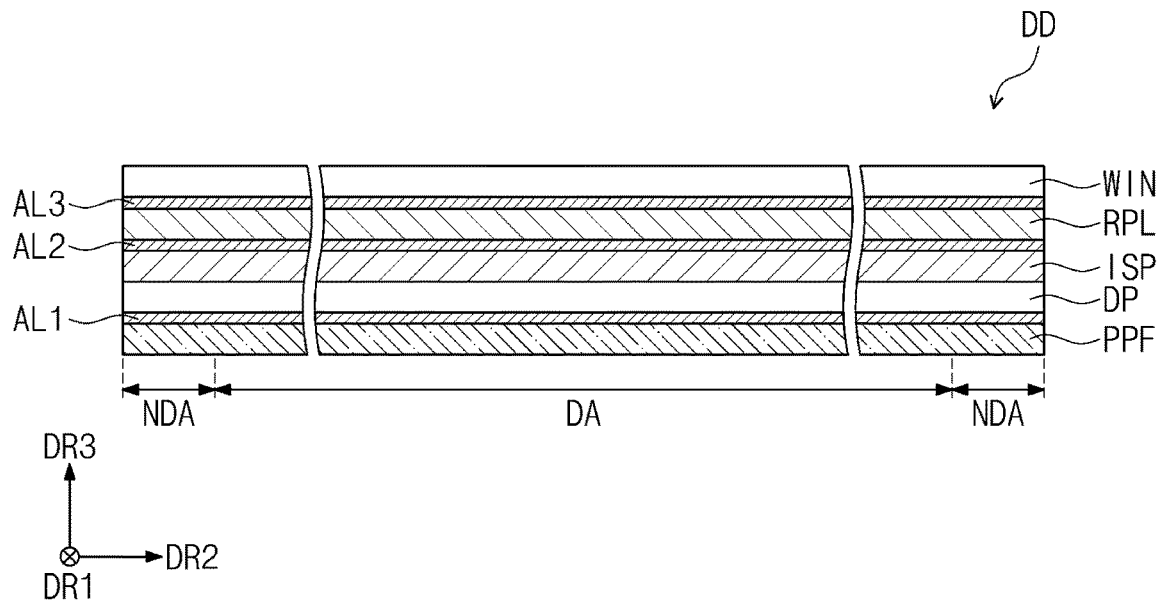
FIG. 3 shows a cross-section of a display device illustrated in FIG. 2.

FIG. 3 shows a cross-section of a display device illustrated in FIG. 2.

The cross-section of the display device DD, which is viewed in the first direction DR1, is illustrated in FIG. 3.

Referring to FIG. 3, in an embodiment, the display device DD includes a display panel DP, an input sensing part ISP, a reflection preventing layer RPL, a window WIN, a panel protecting film PPF, and first to third adhesive layers AL1 to AL3.

The display panel DP is a flexible display panel. The display panel DP according to an embodiment of the present disclosure is a light-emitting display panel, but embodiments are not necessarily limited thereto. For example, in some embodiments, the display panel DP is an organic light-emitting display panel or an inorganic light-emitting display panel. An emissive layer of an organic light-emitting display layer includes an organic light-emitting material. An inorganic light-emitting display panel may include a quantum dot, a quantum rod, etc. Below, the description will focus on an embodiment in which the display panel DP is an organic light-emitting display panel.

The input sensing part ISP is disposed on the display panel DP. The input sensing part ISP includes a plurality of sensing parts that capacitively sense an external input. The input sensing part ISP is manufactured directly on the display panel DP when the display device DD is manufactured. However, embodiments of the present disclosure are not necessarily limited thereto. In an embodiment, the input sensing part ISP is manufactured independently of the display panel DP and is then attached to the display panel DP by an adhesive layer.

The reflection preventing layer RPL may be disposed on the input sensing part ISP. The reflection preventing layer RPL is a film that prevents external light from being reflected. The reflection preventing layer RPL reduces reflectance of external light incident to the display panel DP from above the display device DD.

When external light propagating toward the display panel DP is reflected from the display panel DP to an external user, like a mirror, the user can visually perceive the external light. To prevent the above phenomenon, in an embodiment, the reflection preventing layer RPL includes a plurality of color filters that display the same color as pixels of the display panel DP.

The color filters filter the external light with the same color as the pixels. For example, the external light is not visually perceived by the user. However, embodiments of the present disclosure are not necessarily limited thereto. For example, in an embodiment, the reflection preventing layer RPL includes a retarder and/or a polarizer that reduces the reflectance of external light.

The window WIN is disposed on the reflection preventing layer RPL. The window WIN protects the display panel DP, the input sensing part ISP, and the reflection preventing layer RPL from external scratches and impacts.

The panel protecting film PPF is disposed under the display panel DP. The panel protecting film PPF protects a bottom surface of the display panel DP. The panel protecting film PPF includes a flexible plastic material such as polyethyleneterephthalate (PET).

The first adhesive layer AL1 is interposed between the display panel DP and the panel protecting film PPF. The display panel DP and the panel protecting film PPF are tightly coupled to each other by the first adhesive layer AL1.

The second adhesive layer AL2 is interposed between the reflection preventing layer RPL and the input sensing part ISP. The reflection preventing layer RPL and the input sensing part ISP are tightly coupled to each other by the second adhesive layer AL2.

The third adhesive layer AL3 is interposed between the window WIN and the reflection preventing layer RPL. The window WIN and the reflection preventing layer RPL are tightly coupled to each other by the third adhesive layer AL3.

Figure 4:
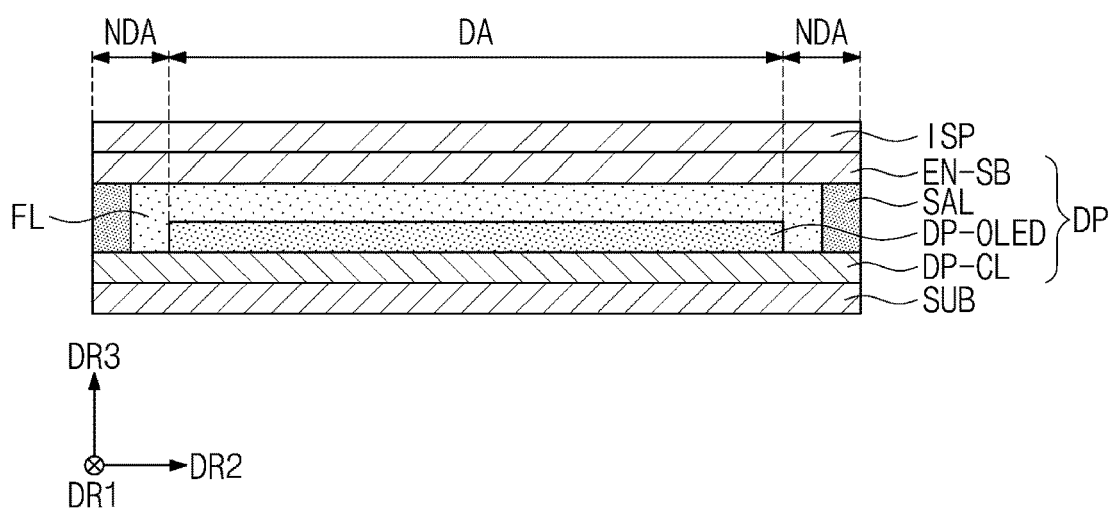
FIG. 4 shows a cross-section of a display panel illustrated in FIG. 3.

FIG. 4 shows a cross-section of a display panel illustrated in FIG. 3.

In an embodiment, the cross-section of the display panel DP, which is viewed in the first direction DR1, is illustrated in FIG. 4, and the input sensing part ISP is illustrated together with the display panel DP.

Referring to FIG. 4, in an embodiment, the display panel DP includes a substrate SUB, a circuit element layer DP-CL, a display element layer DP-OLED, an encapsulation substrate EN-SB, a sealing layer SAL, and a filler FL. The circuit element layer DP-CL is disposed on the substrate SUB. The display element layer DP-OLED is disposed on the circuit element layer DP-CL.

A plurality of pixels are disposed in the circuit element layer DP-CL and the display element layer DP-OLED. Each of the pixels includes transistors in the circuit element layer DP-CL and a light-emitting element in the display element layer DP-OLED and connected with the transistors.

The substrate SUB includes the display area DA and the non-display area NDA around the display area DA. The display element layer DP-OLED is disposed in the display area DA. The encapsulation substrate EN-SB is disposed on the display element layer DP-OLED and edge portions of the circuit element layer DP-CL in the non-display area NDA that are not covered by the display element layer DP-OLED. The substrate SUB and the encapsulation substrate EN-SB are rigid.

The sealing layer SAL is disposed between the substrate SUB and the encapsulation substrate EN-SB. For example, the sealing layer SAL is disposed between the encapsulation substrate EN-SB and the circuit element layer DP-CL of the substrate SUB. The sealing layer SAL is disposed in the non-display area NDA. The sealing layer SAL tightly couples the substrate SUB and the encapsulation substrate EN-SB. The display element layer DP-OLED is sealed between the substrate SUB and the encapsulation substrate EN-SB by the sealing layer SAL. The sealing layer SAL includes a photo-curable material.

The filler FL is disposed between the substrate SUB and the encapsulation substrate EN-SB. For example, the filler is disposed between the encapsulation substrate EN-SB on one side and the circuit element layer DP-CL and the display element layer DP-OLED of the substrate SUB on the other side. The filler FL is disposed in a space that is sealed between the substrate SUB and the encapsulation substrate EN-SB by the sealing layer SAL. The filler FL includes a thermosetting material.

The input sensing part ISP is directly disposed on the display panel DP. For example, the input sensing part ISP is directly disposed on the encapsulation substrate EN-SB.

Figure 5:
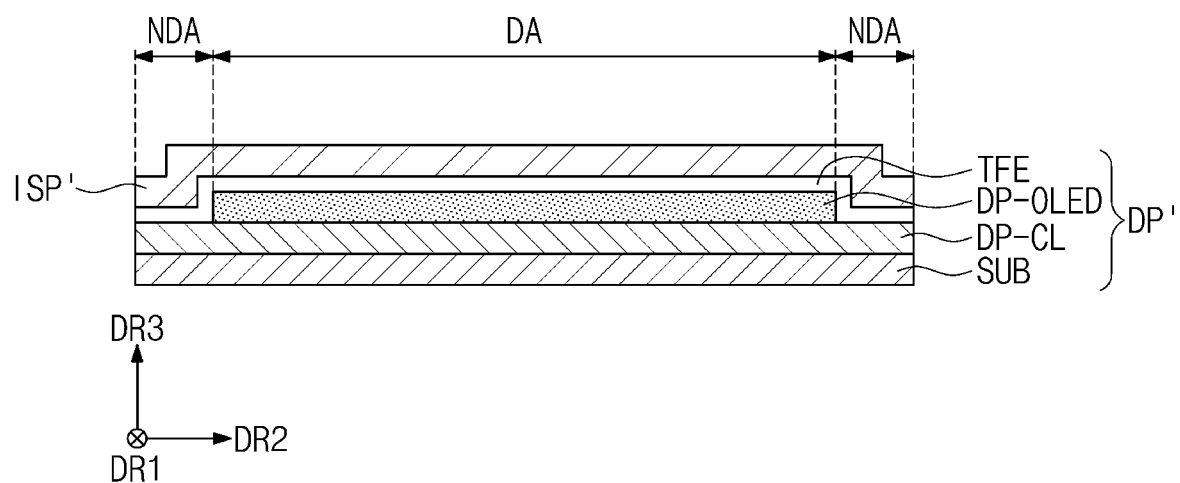
FIG. 5 shows a cross-section of a display panel according to an embodiment of the present disclosure.

FIG. 5 shows a cross-section of a display panel according to an embodiment of the present disclosure.

In an embodiment, an input sensing part ISP' is illustrated in FIG. 5 together with a display panel DP'.

Referring to FIG. 5, in an embodiment, the display panel DP' includes the circuit element layer DP-CL disposed on the substrate SUB, the display element layer DP-OLED disposed on the circuit element layer DP-CL, and a thin film encapsulation layer TFE disposed on the display element layer DP-OLED in the display area DA and on the circuit element layer DP-CL in the non-display area NDA. A layout structure of the circuit element layer DP-CL and the display element layer DP-OLED is substantially identical to a layout structure of the circuit element layer DP-CL and the display element layer DP-OLED illustrated in FIG. 4, and a repeated description thereof is omitted. In FIG. 5, the substrate SUB may be a flexible substrate.

The thin film encapsulation layer TFE is disposed on the circuit element layer DP-CL and covers the display element layer DP-OLED. The thin film encapsulation layer TFE includes inorganic layers and an organic layer between the inorganic layers. The inorganic layers protect the pixels from moisture and/or oxygen. The organic layer protects the pixels from foreign objects such as dust particles.

The input sensing part ISP' is directly disposed on the display panel DP'. For example, the input sensing part ISP' is directly disposed on the thin film encapsulation layer TFE.

Figure 6:
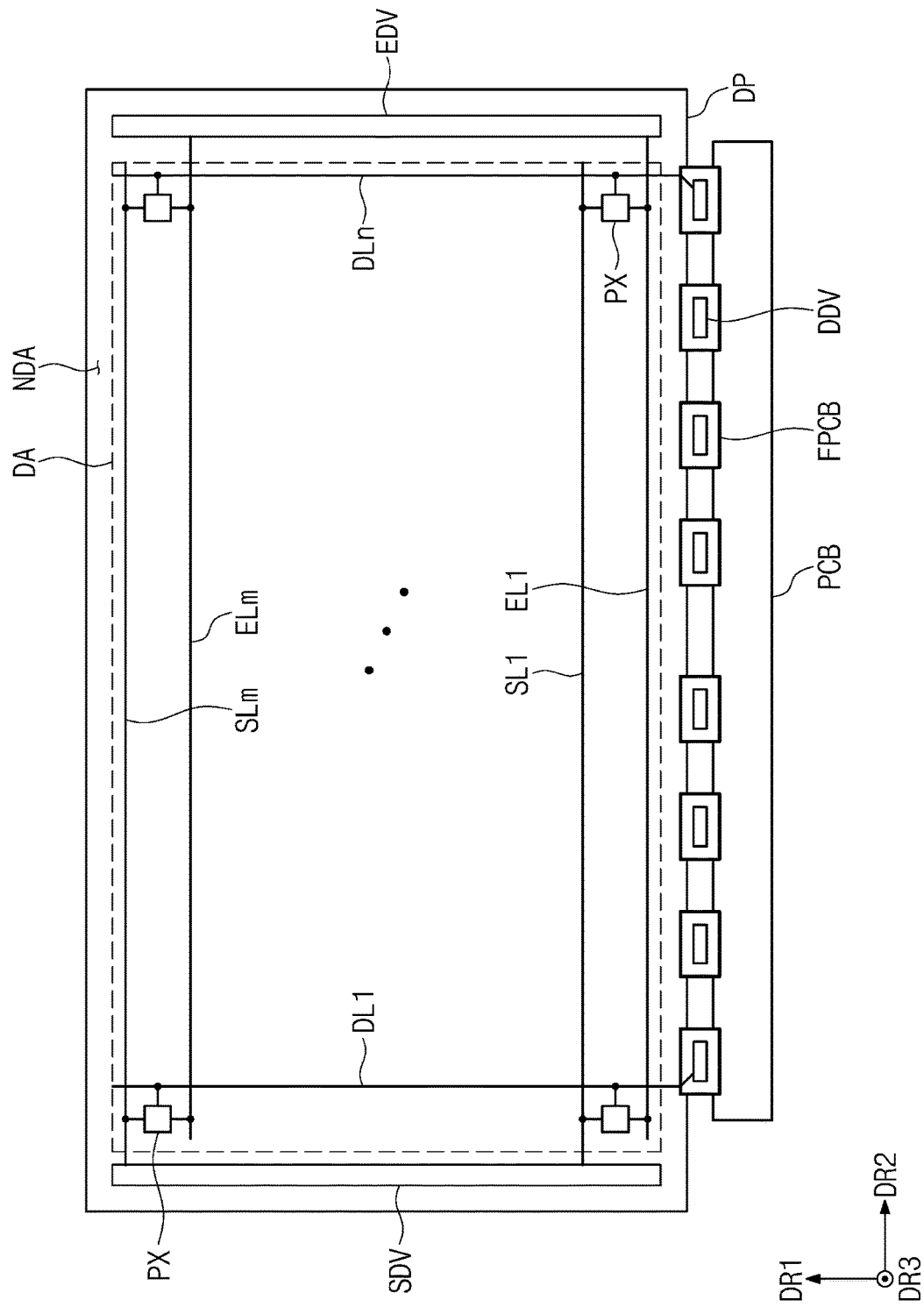
FIG. 6 is a plan view of a display panel illustrated in FIG. 3.

FIG. 6 is a plan view of a display panel illustrated in FIG. 3.

Referring to FIG. 6, in an embodiment, the display device DD includes the display panel DP, a scan driver SDV, a plurality of data drivers DDV, a plurality of flexible circuit boards FPCB, an emission driver EDV, and a printed circuit board PCB.

The display panel DP includes the display area DA and the non-display area NDA around the display area DA. The display area DA and the non-display area NDA of the display panel DP correspond to the display area DA and the non-display area NDA illustrated in FIG. 2, respectively. The display panel DP has a rectangular shape with long sides (or edges) that extend in the second direction DR2 and short sides (e.g., edges) that extend in the first direction DR1. However, the shape of the display panel DP is not necessarily limited thereto.

The display panel DP includes a plurality of pixels PX, a plurality of scan lines SL1 to SLm, a plurality of data lines DL1 to DLn, and a plurality of emission lines EL1 to Elm. Each of 'm' and 'n' is a positive integer.

The pixels PX are disposed in the display area DA. The scan driver SDV and the emission driver EDV are disposed in the non-display area NDA respectively adjacent to the short sides of the display panel DP.

When viewed in a plan view, the data drivers DDV are disposed adjacent to a lower side of the display panel DP, which is one of the long sides of the display panel DP. When viewed in a plan view, the printed circuit board PCB is disposed adjacent to the lower side of the display panel DP. The flexible circuit boards FPCB are connected with the lower side of the display panel DP and the printed circuit board PCB. The data drivers DDV are manufactured as integrated circuit chips and are respectively mounted on the flexible circuit boards FPCB.

The scan lines SL1 to SLm extend in the second direction DR2 and are connected with the pixels PX and the scan driver SDV. The emission lines EL1 to Elm extend in the second direction DR2 and are connected with the pixels PX and the emission driver EDV.

The data lines DL1 to DLn extend in the first direction DR1 and are connected with the pixels PX and the data drivers DDV. For ease of illustration, FIG. 6 shows two data lines DL1 and DLn connected with the data drivers DDV respectively disposed on the leftmost side and the rightmost side. However, substantially, a plurality of data lines are respectively connected with each of the data drivers DDV.

In addition, the display device DD further includes a timing controller that controls operations of the scan driver SDV, the data drivers DDV, and the emission driver EDV. The timing controller is manufactured as an integrated circuit chip and is mounted on the printed circuit board PCB. The timing controller is connected with the scan driver SDV, the data drivers DDV, and the emission driver EDV through the printed circuit board PCB and the flexible circuit boards FPCB.

The scan driver SDV generates a plurality of scan signals, and the scan signals are transmitted to the pixels PX through the scan lines SL1 to SLm. The data drivers DDV generate a plurality of data voltages, and the data voltages are transmitted to the pixels PX through the data lines DL1 to DLn. The emission driver EDV generates a plurality of emission signals, and the emission signals are transmitted to the pixels PX through the emission lines EL1 to Elm.

The pixels PX receive the data voltages in response to the scan signals. The pixels PX display images by emitting light whose luminance corresponds to the data voltages in response to the emission signals. The emission time of the pixels PX is controlled by the emission signals.

Figure 7:
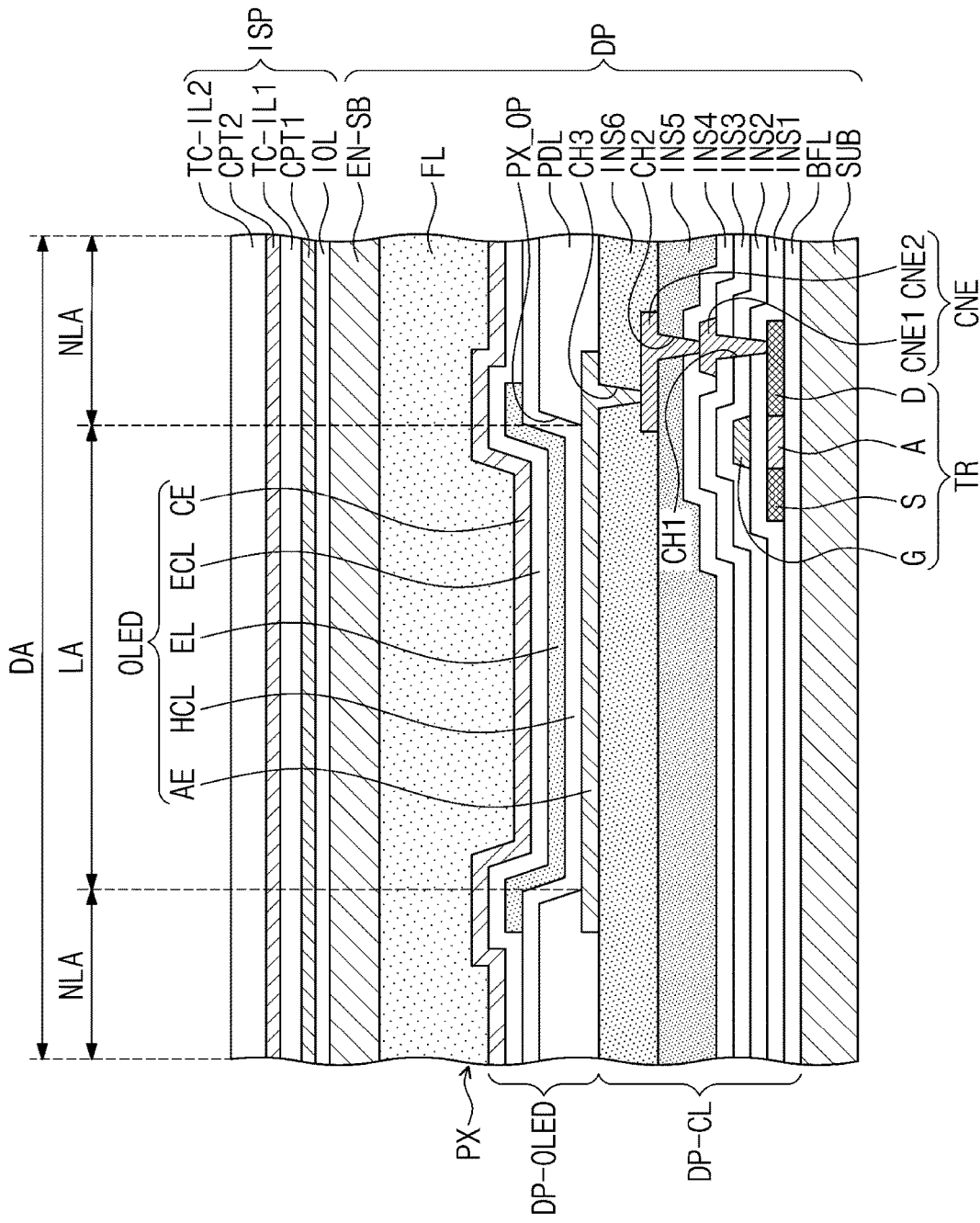
FIG. 7 shows a cross-section structure of a pixel and an input sensing part of a display panel illustrated in FIG. 4.

FIG. 7 shows a cross-section of a pixel and an input sensing part of a display panel illustrated in FIG. 4.

The pixel PX illustrated in FIG. 7 is one of the pixels PX illustrated in FIG. 6.

Referring to FIG. 7, in an embodiment, the pixel PX includes a transistor TR and a light-emitting element OLED. The light-emitting element OLED includes a first electrode (or an anode) AE, a second electrode (or a cathode) CE, a hole control layer HCL, an electron control layer ECL, and an emissive layer EL.

The transistor TR and the light-emitting element OLED are disposed on the substrate SUB. FIG. 7 illustrates one transistor TR. However, substantially, the pixel PX includes a plurality of transistors and at least one capacitor that drive the light-emitting element OLED.

The display area DA includes a light-emitting area LA that corresponds to each of the pixels PX and a non-light-emitting area NLA around the light-emitting area LA. The light-emitting element OLED is disposed in the light-emitting area LA.

A buffer layer BFL is disposed on the substrate SUB, and the buffer layer BFL is an inorganic layer. A semiconductor pattern is disposed on the buffer layer BFL. The semiconductor pattern includes one of polysilicon, amorphous silicon, or a metal oxide.

The semiconductor pattern is doped with an N-type dopant or a P-type dopant. The semiconductor pattern includes a highly doped area and a lightly doped area. The conductivity of the highly doped area is greater than the conductivity of the lightly doped area and substantially function as a source electrode and a drain electrode of the transistor TR. The lightly doped area substantially corresponds to an active region (or channel) of the transistor TR.

A source "S", an active region "A", and a drain "D" of the transistor TR are formed from the semiconductor pattern. A first insulating layer INS1 is disposed on the semiconductor pattern and the buffer layer BFL. A gate "G" of the transistor TR is disposed on the first insulating layer INS1. A second insulating layer INS2 may be disposed on the first insulating layer INS1 and the gate "G". A third insulating layer INS3 may be disposed on the second insulating layer INS2.

A connecting electrode CNE includes a first connecting electrode CNE1 and a second connecting electrode CNE2 that connect the transistor TR and the light-emitting element OLED. The first connecting electrode CNE1 is disposed on the third insulating layer INS3 and is connected with the drain "D" through a first contact hole CH1 formed in the first to third insulating layers INS1 to INS3.

A fourth insulating layer INS4 is disposed on the third insulating layer INS3 and the first connecting electrode CNE1. A fifth insulating layer INS5 is disposed on the fourth insulating layer INS4. The second connecting electrode CNE2 is disposed on the fifth insulating layer INS5. The second connecting electrode CNE2 is connected with the first connecting electrode CNE1 through a second contact hole CH2 formed in the fourth and fifth insulating layers INS4 and INS5.

A sixth insulating layer INS6 is disposed on the fifth insulating layer INS5 and the second connecting electrode CNE2. Layers from the buffer layer BFL to the sixth insulating layer INS6 form the circuit element layer DP-CL. The first insulating layer INS1 to the sixth insulating layer INS6 may be inorganic layers or organic layers.

The first electrode AE is disposed on the sixth insulating layer INS6. The first electrode AE is connected with the second connecting electrode CNE2 through a third contact hole CH3 formed in the sixth insulating layer INS6. A pixel defining layer PDL is disposed on the first electrode AE and the sixth insulating layer INS6. The pixel defining layer PDL includes an opening PX_OP that exposes a portion of the first electrode AE.

The hole control layer HCL is disposed on the first electrode AE and the pixel defining layer PDL. The hole control layer HCL includes a hole transport layer and a hole injection layer.

The emissive layer EL is disposed on the hole control layer HCL. The emissive layer EL is disposed in an area that corresponds to the opening PX_OP. The emissive layer EL may include an organic material and/or an inorganic material. The emissive layer EL generates one of red light, green light, or blue light.

The electron control layer ECL is disposed on the emissive layer EL and the hole control layer HCL. The electron control layer ECL includes an electron transport layer and an electron injection layer. The hole control layer HCL and the electron control layer ECL are disposed in common in the light-emitting area LA and the non-light-emitting area NLA.

The second electrode CE is disposed on the electron control layer ECL. The second electrode CE is disposed in common in the pixels PX. For example, the second electrode CE is disposed across the display area DA as a plate electrode or a common electrode. A layer in which the light-emitting element OLED is disposed is the display element layer DP-OLED.

A first voltage is applied to the first electrode AE through the transistor TR, and a second voltage is applied to the second electrode CE. The second voltage is a common voltage. Holes and electrons injected into the emissive layer EL combine to form excitons. As the excitons transition to a ground state, the light-emitting element OLED emits light.

The filler FL is disposed on the second electrode CE and covers the pixels PX. The encapsulation substrate EN-SB is disposed on the filler FL. The input sensing pan ISP is disposed on the encapsulation substrate EN-SB.

An insulating layer IOL is disposed on the encapsulation substrate EN-SB. The insulating layer IOL includes an inorganic insulating layer. One or more insulating layers IOL are disposed on the encapsulation substrate EN-SB. For example, two inorganic insulating layers IOL are sequentially stacked on the encapsulation substrate EN-SB.

The input sensing part ISP includes a first conductive layer CPT1 and a second conductive layer CPT2. The first and second conductive layers CPT1 and CPT2 include a transparent conductive material. For example, the first and second conductive layers CPT1 and CPT2 include a transparent conductive material such as at least one of indium tin oxide (ITO), indium zinc oxide (IZO), zinc oxide (ZnO), or indium zinc tin oxide (IZTO).

The first conductive layer CPT1 is disposed on the insulating layer IOL. A first insulating layer TC-IL1 is disposed on the insulating layer IOL. The first insulating layer TC-IL1 covers the first conductive layer CPT1. The first insulating layer TC-IL1 may include an inorganic insulating layer or an organic insulating layer.

The second conductive layer CPT2 is disposed on the first insulating layer TC-IL1. The sensing electrodes of the input sensing part ISP are formed by the first and second conductive layers CPT1 and CPT2, which will be described in detail below. When viewed in a plan view, the first and second conductive layers CPT1 and CPT2 overlap the light-emitting area LA. Light generated by the light-emitting element OLED propagates upward through the transparent first and second conductive layers CPT1 and CPT2.

A second insulating layer TC-IL2 is disposed on the first insulating layer TC-IL1. The second insulating layer TC-IL2 covers the second conductive layer CPT2. The second insulating layer TC-IL2 includes an organic insulating layer.

When the pixel PX is driven, signals transmitted through lines connected with the transistor TR can affect signals transmitted through the first and second conductive layers CPT1 and CPT2. Noise can occur in the input sensing part ISP due to the signal interference. However, in an embodiment of the present disclosure, the second electrode CE supplied with the common voltage is disposed across the display area DA, and thus, the signal interference is blocked. As a result, noise of the input sensing part ISP is reduced.

Figure 8:
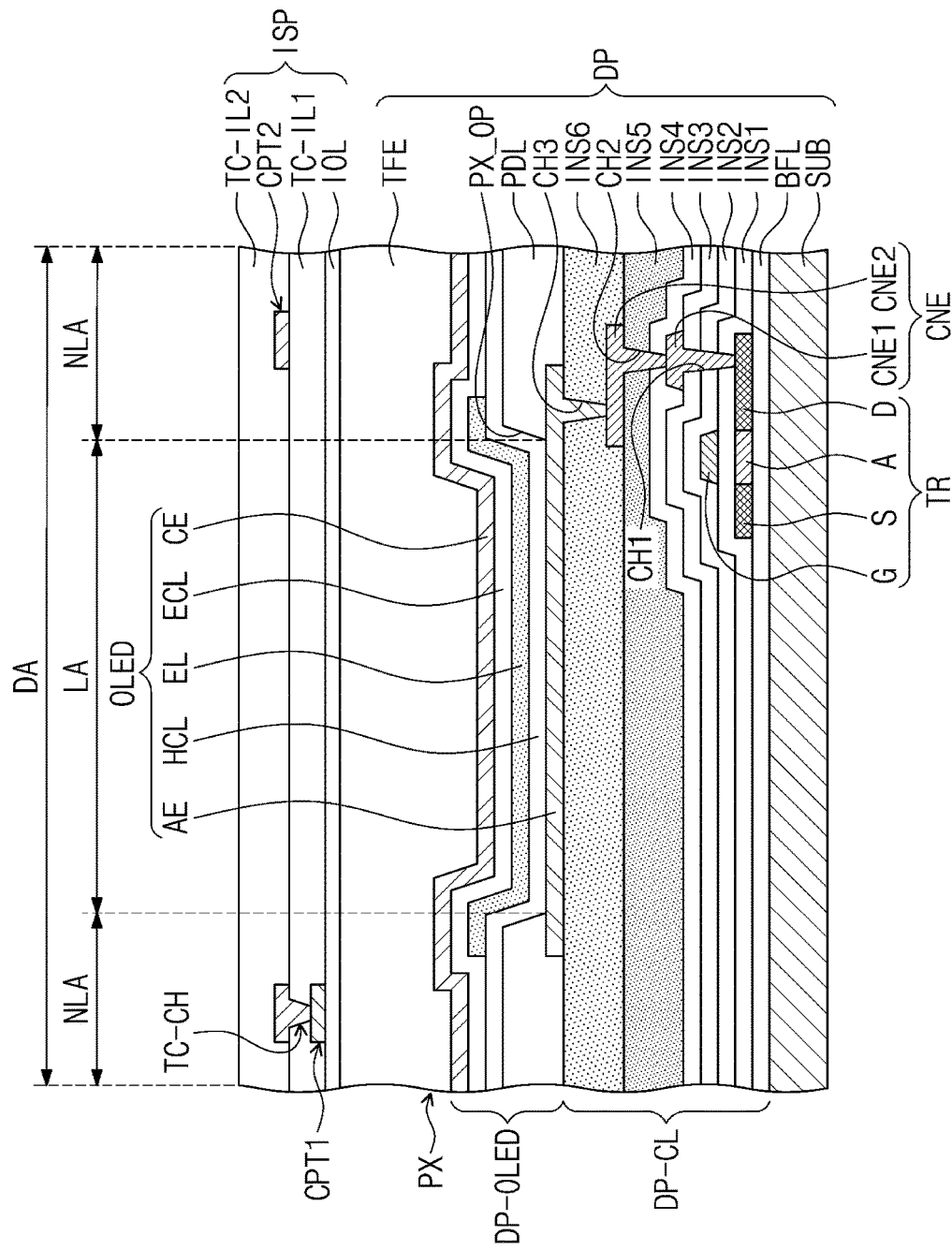
FIG. 8 shows a cross-section of a structure of a pixel and an input sensing part according to an embodiment of the present disclosure.

FIG. 8 shows a cross-section of a pixel and an input sensing part according to an embodiment of the present disclosure.

A pixel PX' illustrated in FIG. 8 is a pixel of a display panel DP' illustrated in FIG. 5. A structure of the pixel PX' illustrated in FIG. 8 is substantially identical to that of the pixel PX illustrated in FIG. 7, and a repeated description thereof is omitted. Below, the structure of the input sensing part ISP' illustrated in FIG. 8 will be described based on components that differ from those of the input sensing part ISP illustrated in FIG. 7.

Referring to FIG. 8, in an embodiment, the insulating layer IOL is disposed on the thin film encapsulation layer TFE. The input sensing part ISP' includes the first conductive layer CPT1 and the second conductive layer CPT2. The first conductive layer CPT1 is disposed on the insulating layer IOL. When viewed in a plan view, the first conductive layer CPT1 does not overlap the light-emitting area LA and but does overlap the non-light-emitting area NLA. The first insulating layer TC-IL1 is disposed on the insulating layer IOL and covers the first conductive layer CPT1.

The second conductive layer CPT2 is disposed on the first insulating layer TC-IL1. When viewed in a plan view, the second conductive layer CPT2 does not overlap the light-emitting area LA but does overlap the non-light-emitting area NLA. A portion of the second conductive layer CPT2 is connected with the first conductive layer CPT1 through a contact hole TC-CH formed in the first insulating layer TC-IL1. The sensing electrodes of the input sensing part ISP' are formed by the first and second conductive layers CPT1 and CPT2, which will be described in detail below. The second insulating layer TC-IL2 is disposed on the first insulating layer TC-IL1 and covers the second conductive layer CPT2.

The first and second conductive layers CPT1 and CPT2 include a metal. For example, the first and second conductive layers CPT1 and CPT2 include one or more of molybdenum, silver, titanium, copper, aluminum, or an alloy thereof. Because the first and second conductive layers CPT1 and CPT2, which can reflect light, are not disposed in the light-emitting area LA, light generated by the light-emitting element OLED propagates upwardly through the light-emitting area LA. The first and second conductive layers CPT1 and CPT2 have a mesh shape, which will be described in detail below.

Figure 9:
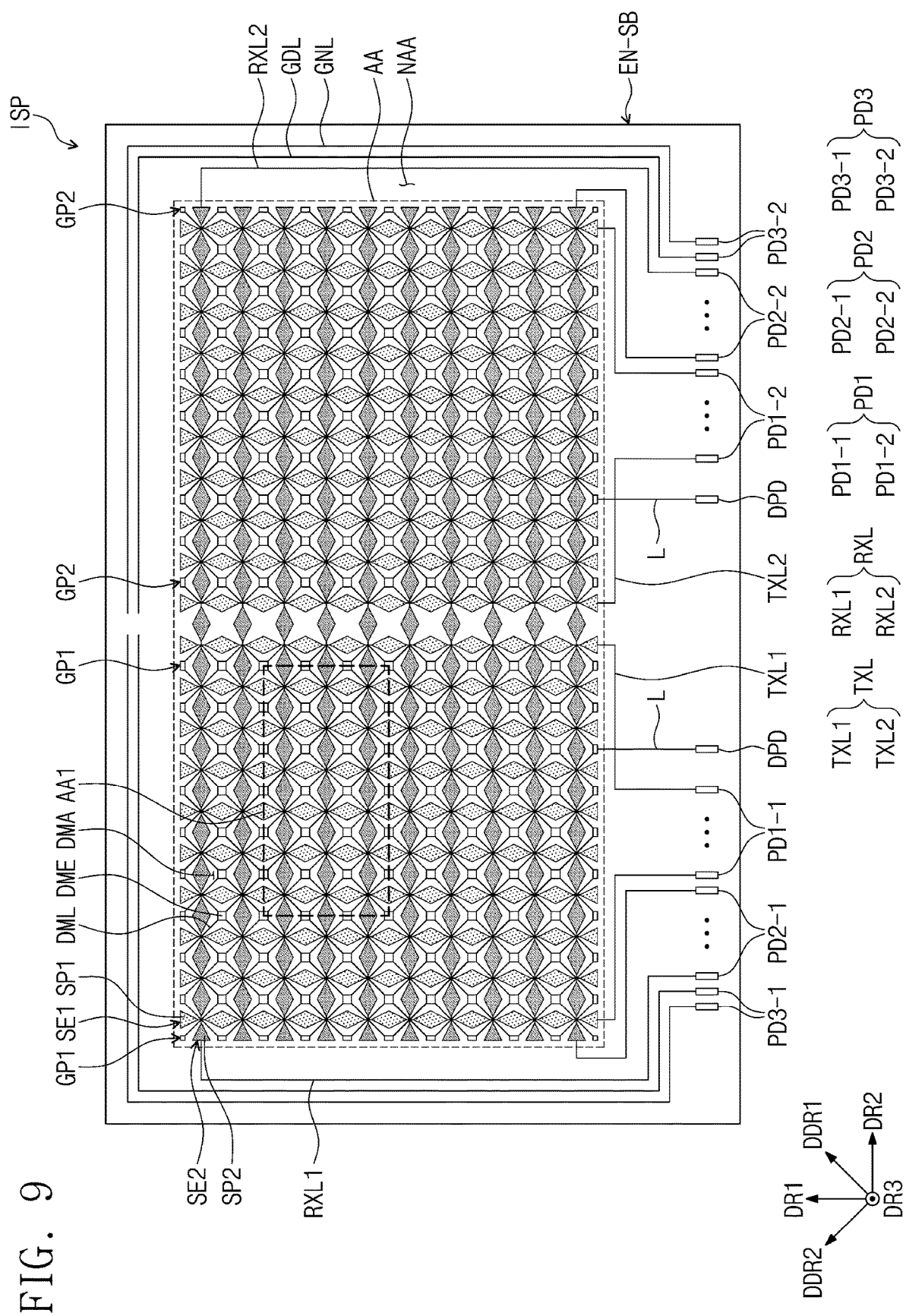
FIG. 9 is a plan view of an input sensing part illustrated in FIG. 4.
Figure 10:
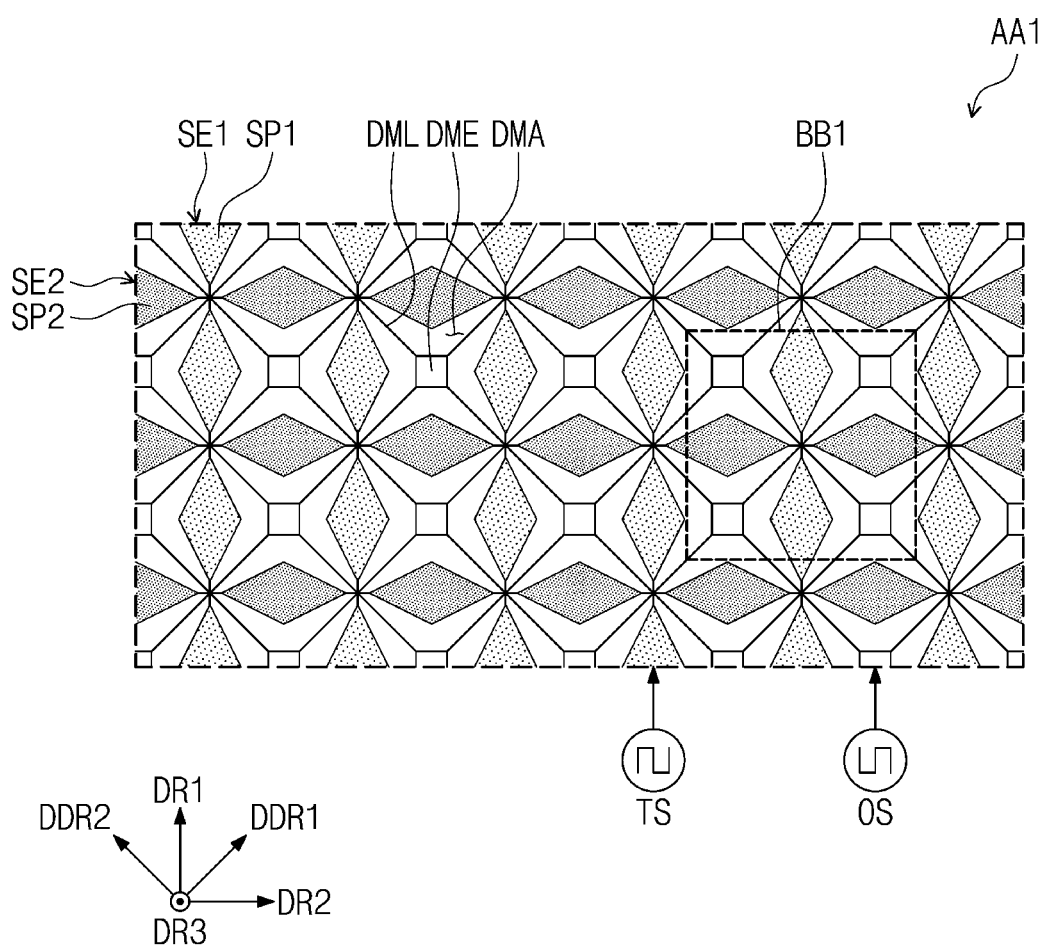
FIG. 10 is an enlarged view of area AA1 illustrated in FIG. 9.

FIG. 9 is a plan view of an input sensing part illustrated in FIG. 4. FIG. 10 is an enlarged view of area AA1 illustrated in FIG. 9.

Referring to FIGS. 9 and 10, in an embodiment, the input sensing part ISP includes a plurality of sensing electrodes SE1 and SE2, a plurality of sensing lines TXL and RXL, a guard line GDL, a ground line GNL, a plurality of first pads PD1, a plurality of second pads PD2, a plurality of third pads PD3, a plurality of dummy electrodes DME, a plurality of dummy lines DML, a plurality of lines "L", and a plurality of dummy pads DPD.

The sensing electrodes SE1 and SE2, the sensing lines TXL and RXL, the guard line GDL, the ground line GNL, the dummy electrodes DME, the dummy lines DML, the dummy pads DPD, and the first, second, and third pads PD1, PD2, and PD3 are disposed on the encapsulation substrate EN-SB illustrated in FIGS. 4 and 7.

When viewed in a plan view, a planar area of the input sensing part ISP includes an active area AA and a non-active area NAA around the active area AA. The non-active area NAA surrounds the active area AA. When viewed in a plan view, the active area AA overlaps the display area DA, and the non-active area NAA overlaps the non-display area NDA.

The sensing electrodes SE1 and SE2, the dummy electrodes DME, and the dummy lines DML are disposed in the active area AA. The first, second, and third pads PD1, PD2, and PD3 and the dummy pads DPD are disposed in the non-active area NAA. The first, second, and third pads PD1, PD2, and PD3 and the dummy pads DPD are disposed in a portion of the non-active area NAA, hereinafter referred to as a "lower-side non-active area", adjacent to a lower side of the active area AA, when viewed in a plan view. The first, second, and third pads PD1, PD2, and PD3 are distributed and disposed on the left side and the right side with respect to the center of the lower-side non-active area NAA.

The first pads PD1 include a plurality of (1-1)-th pads PD1-1 and a plurality of (1-2)-th pads PD1-2. The second pads PD2 include a plurality of (2-1)-th pads PD2-4 and a plurality of (2-2)-th pads PD2-2. The third pads PD3 include a plurality of (3-1)-th pads PD3-1 and a plurality of (3-2)-th pads PD3-2.

The (1-1)-th pads PD1-1, the (2-1)-th pads PD2-1, and the (3-1)-th pads PD3-1 are disposed on the left side with respect to the center of the lower-side non-active area NAA. The (1-2)-th pads PD1-2, the (2-2)-th pads PD2-2, and the (3-2)-th pads PD3-2 are disposed on the right side with respect to the center of the lower-side non-active area NAA.

In the lower-side non-active area NAA, the (2-1)-th pads PD2-1 are disposed closer to the left side than the (1-1)-th pads PD1-1 with respect to the second direction DR2, and the (3-1)-th pads PD3-1 are disposed closer to the left side than the (2-1)-th pads PD2-1 with respect to the second direction DR2. Accordingly, the (2-1)-th pads PD2-1 are disposed between the (1-1)-th pads PD1-1 and the (3-1)-th pads PD3-1.

In the lower-side non-active area NAA, the (2-2)-th pads PD2-2 are disposed closer to the right side than the (1-2)-th pads PD1-2 with respect to the second direction DR2, and the (3-2)-th pads PD3-2 are disposed closer to the right side than the (2-2)-th pads PD2-2 with respect to the second direction DR2. Accordingly, the (2-2)-th pads PD2-2 are disposed between the (1-2)-th pads PD1-2 and the (3-2)-th pads PD3-2. The dummy pads DPD are disposed between the (1-1)-th pads PD1-1 and the (1-2)-th pads PD1-2.

The sensing lines TXL and RXL are connected with the sensing electrodes SE1 and SE2 and extend through the non-active area NAA to connect with the first and second pads PD1 and PD2. In addition, a sensing control part that controls the input sensing part ISP is connected with the first and second pads PD1 and PD2.

The sensing electrodes SE1 and SE2 include a plurality of first sensing electrodes SE1 that extend in the first direction DR1 and are arranged in the second direction DR2, and a plurality of second sensing electrodes SE2 that extend in the second direction DR2 and are arranged in the first direction DR1. The second sensing electrodes SE2 are insulated from the first sensing electrodes SE1 and intersect the first sensing electrodes SE1.

The sensing lines TXL and RXL include a plurality of first sensing lines TXL connected with the first sensing electrodes SE1 and a plurality of second sensing lines RXL connected with the second sensing electrodes SE2. The first sensing lines TXL are connected with first ends of the first sensing electrodes SE1. The first ends of the first sensing electrodes SE1 are adjacent to the lower-side non-active area NAA. The second sensing lines RXL are connected with opposite ends of the second sensing electrodes SE2. The opposite ends of the second sensing electrodes SE2 face away from each other in the second direction DR2.

The first sensing lines TXL extend through the non-active area NAA and are connected with the first pads PD1. The first sensing lines TXL extend to the lower-side non-active area NAA.

The second sensing lines RXL extend through the non-active area NAA and are connected with the second pads PD2. The second sensing lines RXL extend through the non-active area NAA adjacent to opposite sides of the active area AA, which face away from each other in the second direction DR2 and the lower-side non-active area NAA.

The first sensing lines TXL include a plurality of first sensing lines TXL1 and a plurality of second sensing lines TXL2. The first sensing lines TXL1 are disposed in the lower-side non-active area and are connected with some of the first sensing electrodes SE1 and the (1-1)-th pads PD1-1. In an embodiment, the first sensing lines TXL1 are connected with first ends of the first sensing electrodes SE1 disposed on the left side with respect to the center of the active area AA.

The second sensing lines TXL2 are disposed in the lower-side non-active area and are connected with the remaining first sensing electrodes SE1 and the (1-2)-th pads PD1-2. In an embodiment, the second sensing lines TXL2 are connected with second ends of the first sensing electrodes SE1 disposed on the right side with respect to the center of the active area AA.

The second sensing lines RXL include a plurality of first receive lines RXL1 and a plurality of second receive lines RXL2. The first receive lines RXL1 are connected with first ends of the second sensing electrodes SE2 and the (2-1)-th pads PD2-1. In an embodiment, the first receive lines RXL1 are disposed in the non-active area NAA, hereinafter referred to as a "left-side non-active area", adjacent to the left side of the active area AA, when viewed in a plan view, and the first ends of the second sensing electrodes SE2 are adjacent to the left-side non-active area NAA.

The second receive lines RXL2 are connected with second ends of the second sensing electrodes SE2 and the (2-2)-th pads PD2-2. In an embodiment, the second receive lines RXL2 are disposed in the non-active area NAA, hereinafter referred to as a "right-side non-active area", adjacent to the right side of the active area AA, when viewed in a plan view, and the second ends of the second sensing electrodes SE2 are adjacent to the right-side non-active area NAA.

The sensing control part applies driving signals TS to the first sensing lines TXL through the first pads PD1. The driving signals TS are applied to the first sensing electrodes SE1 through the first sensing lines TXL.

A change in capacitance formed between the first and second sensing electrodes SE1 and SE2 is output through the second sensing lines RXL as a sensing signal. The sensing signals output through the second sensing lines RXL are provided to the sensing control part through the second pads PD2.

Each of the first sensing electrodes SE1 includes a plurality of first sensing parts SP1 arranged in the first direction DR1. The first sensing parts SP1 are connected through connection patterns, which will be described in detail with reference to FIG. 12.

Each of the second sensing electrodes SE2 includes a plurality of second sensing parts SP2 arranged in the second direction DR2. The second sensing electrodes SE2 are integrally formed through extension patterns, which will be described in detail with reference to FIG. 12.

The first sensing parts SP1 and the second sensing parts SP2 do not overlap each other and are spaced from each other. For example, the first sensing parts SP1 and the second sensing parts SP2 are alternately disposed. Capacitances are formed by the first sensing parts SP1 and the second sensing parts SP2.

Below, the non-active area NAA adjacent to an upper side of the active area AA, when viewed in a plan view, is referred to as an "upper-side non-active area NAA".

The guard line GDL and the ground line GNL are spaced from the sensing lines TXL and RXL and are disposed in the non-active area NAA. The guard line GDL and the ground line GNL surround three sides of the rectangular active area AA. For example, the guard line GDL and the ground line GNL are disposed in the left-side non-active area NAA, the right-side non-active area NAA, and the upper-side non-active area NAA.

The guard line GDL and the ground line GNL are connected with the third pads PD3. First ends of the guard line GDL and the ground line GNL are connected with the (3-1)-th pads PD3-1. Second ends of the guard line GDL and the ground line GNL are connected with the (3-2)-th pads PD3-2. The guard line GDL and the ground line GNL extend along an edge of the input sensing part ISP in the left-side non-active area NAA, the right-side non-active area NAA, and the upper-side non-active area NAA.

The guard line GDL and the ground line GNL are disposed in the non-active area NAA so as to be closer to the edge than the sensing lines TXL and RXL. For example, the guard line GDL and the ground line GNL are disposed in the left-side non-active area NAA and the right-side non-active area NAA so as to be closer to the edge than the second sensing lines RXL.

The guard line GDL is closer to the active area AA than the ground line GNL. The guard line GDL is closer to the sensing lines TXL and RXL than the ground line GNL. The ground line GNL is closer to the edge than the guard line GDL.

The guard line GDL and the ground line GNL are separated in the upper-side non-active area NAA. However, embodiments of the present disclosure are not necessarily limited thereto. For example, in an embodiment, the guard line GDL and the ground line GNL extend across the upper-side non-active area NAA without a break or opening.

When viewed in a plan view, the dummy areas DMA are located between the first sensing electrodes SE1 and the second sensing electrodes SE2. The dummy electrodes DME are disposed in the dummy areas DMA. When viewed in a plan view, the dummy electrodes DME are disposed in the dummy areas DMA located between the first and second sensing parts SP1 and SP2.

The dummy electrodes DME are arranged in a first diagonal direction DDR1 and a second diagonal direction DDR2. The dummy lines DML extend from the dummy electrodes DME, respectively. The dummy lines DML extend in the first diagonal direction DDR1 and the second diagonal direction DDR2.

The first diagonal direction DDR1 is a direction intersecting the first and second directions DR1 and DR2 in a plane defined by the first and second directions DR1 and DR2. The second diagonal direction DDR2 is a direction that intersects the first diagonal direction DDR1 in the plane defined by the first and second directions DR1 and DR2.

The dummy electrodes DME and the dummy lines DML are divided into a first group GP1 and a second group GP2. The dummy electrodes DME and the dummy lines DML in the first group GP1 and the dummy electrodes DME and the dummy lines DML in the second group GP2 are separately and respectively disposed on the left side and the right side with respect to a central portion of the active area AA.

The dummy electrodes DME and the dummy lines DML in the first group GP1 are integrally connected with each other. The dummy electrodes DME and the dummy lines DML in the second group GP2 are integrally connected with each other. The dummy electrodes DME and the dummy lines DML in the first group GP1 are separated from the dummy electrodes DME and the dummy lines DML in the second group GP2.

The dummy electrodes DME in the first group GP1 are connected with each other and are connected with a corresponding dummy pad DPD of the dummy pads DPD. The dummy electrodes DME in the second group GP2 are connected with each other and are connected with a corresponding dummy pad DPD of the dummy pads DPD.

The lines "L" are disposed in the lower-side non-active area NAA and are respectively connected with the dummy pads DPD. The dummy electrodes DME in the first group GP1 are connected with a corresponding line "L" to be connected with the corresponding dummy pad DPD. The dummy electrodes DME in the second group GP2 are connected with a corresponding line "L" to be connected with the corresponding dummy pad DPD.

In an embodiment, the dummy electrodes DME and the dummy lines DML are divided into two groups, but embodiments of the present disclosure are not necessarily limited thereto. For example, in some embodiments, the dummy electrodes DME and the dummy lines DML are divided into three or more groups.

The dummy electrodes DME and the dummy lines DML are connected by dummy connection patterns disposed adjacent to intersections of the first sensing electrodes SE1 and the second sensing electrodes SE2. This configuration will be described in detail below.

A ground voltage is applied to the ground line GNL. The ground line GNL is connected with a ground terminal of the display device DD through the (3-1)-th and (3-2)-th pads PD3-1 and PD3-2. External static electricity is applied to the input sensing part ISP. For example, the external static electricity is discharged to the ground terminal through the ground line GNL. Accordingly, the input sensing part ISP is protected from external static electricity by the ground line GNL.

The guard line GDL is connected with the sensing control part through the (3-1)-th and (3-2)-th pads PD3-1 and PD3-2. The sensing control part applies a predetermined signal to the guard line GDL.

A coupling can occur between the ground line GNL and the sensing lines TXL and RXL due to a potential difference between the ground line GNL and the sensing lines TXL and RXL. For example, noise can occur due to signal interference between the ground line GNL and the sensing lines TXL and RXL.

To reduce the above noise, a signal with a given noise level is applied to the guard line GDL. The guard line GDL is disposed between the ground line GNL and the sensing lines TXL and RXL and reduces the coupling between the ground line GNL and the sensing lines TXL and RXL.

The sensing control part applies an offset signal OS with a given frequency to the dummy electrodes DME. The offset signal OS is applied to the dummy lines DML and the dummy electrodes DME through the dummy pads DPD.

When the driving signals TS with a given frequency are applied to the first sensing electrodes SE1, an electromagnetic wave associated with the driving signals TS radiates as an electromagnetic signal. The electromagnetic signal acts as noise and may electromagnetically interfere with other devices. For example, the electromagnetic signal can interfere with operations of the other devices. For example, the electromagnetic signal of the input sensing part ISP can affect the operation of the display panel DP.

A phase of the offset signal OS may be opposite to a phase of a driving signal TS. Because the phase of the offset signal OS is opposite to the phase of the driving signal TS that is applied to the active area AA, the electromagnetic signal is offset by the offset signal OS. As the offset signals OS whose phase is opposite to the phase of the driving signals TS are applied to the dummy electrodes DME, the electromagnetic signal occurring in the input sensing part ISP is attenuated by the offset signal OS.

In an embodiment of the present disclosure, noise and the electromagnetic signal are reduced in the input sensing part ISP by the guard line GDL, the dummy electrodes DME, and the ground line GNL, and the input sensing part ISP is thus protected from the external static electricity. Accordingly, the reliability of the input sensing part ISP operation is increased.

Figure 11A:
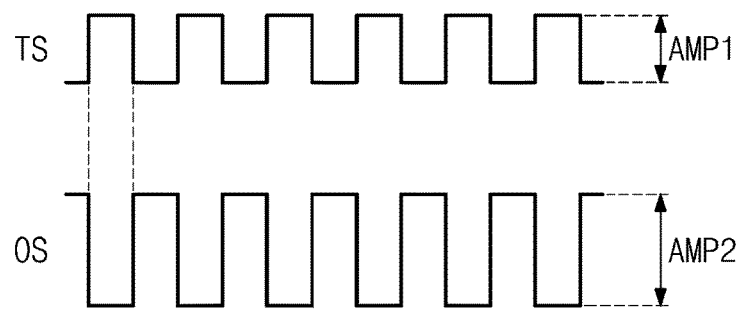
FIG. 11A illustrates a timing of a driving signal applied to a first sensing electrode illustrated in FIG. 10 and an offset signal applied to a dummy electrode illustrated in FIG. 10.

FIG. 11A illustrates timings of a driving signal applied to a first sensing electrode illustrated in FIG. 10 and an offset signal applied to a dummy electrode illustrated in FIG. 10. FIGS. 11B to 11F are timing diagrams of a driving signal and an offset signal according to various embodiments of the present disclosure.

Referring to FIGS. 10 and 11A, in an embodiment, the driving signal TS with a given frequency is applied to the first sensing electrode SE1, and the offset signal OS with a given frequency is applied to the dummy electrode DME. A phase of the offset signal OS is opposite to a phase of the driving signal TS. A second amplitude AMP2 of the offset signal OS is greater than a first amplitude AMP1 of the driving signal TS.

An electromagnetic signal occurs in the input sensing part ISP due to the driving signal TS. Because the phase of the offset signal OS is opposite to the phase of the driving signal TS being applied to the active area AA, the electromagnetic signal is offset by the offset signal OS.

The intensity of the electromagnetic signal is proportional to the number of the first sensing electrodes SE1 and the area of the first sensing electrode SE1. The area of the first sensing electrode SE1 is greater than the area of the dummy electrode DME. Accordingly, a magnitude of an electromagnetic signal EMS is increased. In an embodiment of the present disclosure, because the offset signal OS has a greater amplitude than the driving signal TS, the offset signal OS can offset the electromagnetic signal EMS.

Figure 11B:
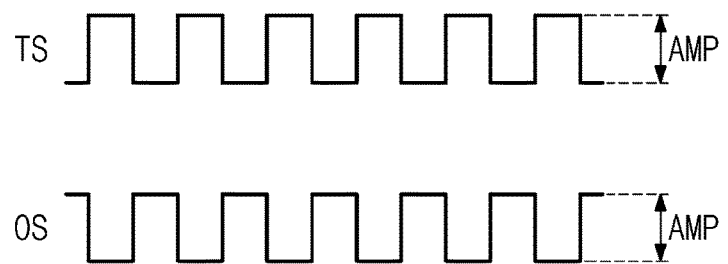
FIGS. 11B to 11F are timing diagrams of a driving signal and an offset signal according to various embodiments of the present disclosure.

Referring to FIG. 11B, in an embodiment, a phase of the offset signal OS is opposite to a phase of the driving signal IS. An amplitude AMP of the offset signal OS is equal to an amplitude AMP of the driving signal TS.

Figure 11C:
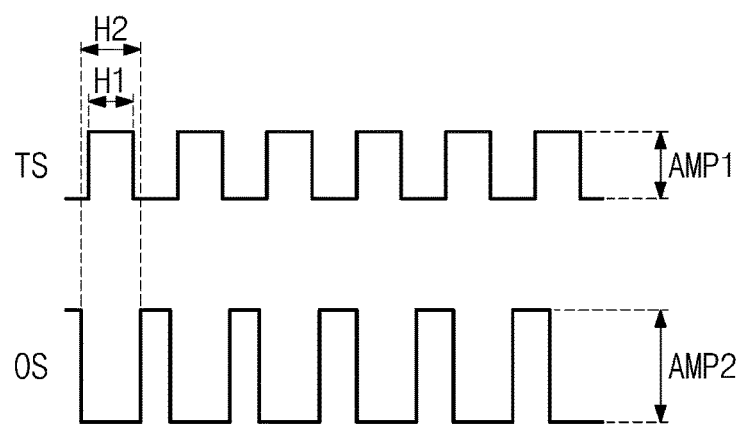

Referring to FIG. 11C, in an embodiment, a phase of the offset signal OS is opposite to a phase of the driving signal TS. The second amplitude AMP2 of the offset signal OS is greater than the first amplitude AMP1 of the driving signal TS. The driving signal TS has an enable period H1. The enable period H1 is a high-level period in one cycle. The offset signal OS has a disable period H2. The disable period H2 is a low-level period in one cycle. The disable period H2 of the offset signal OS is greater than the enable period H1 of the driving signal TS.

Figure 11D:
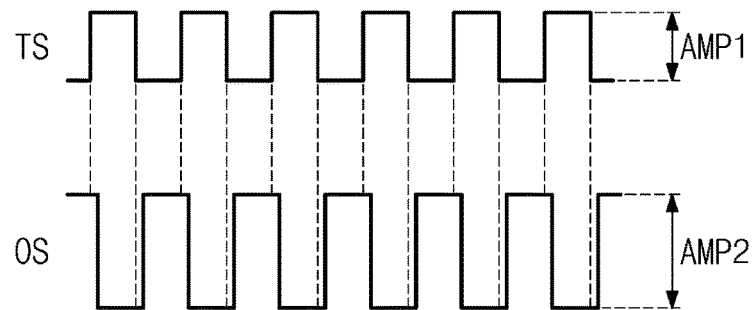

Referring to FIG. 11D, in an embodiment, a phase of the offset signal OS is opposite to a phase of the driving signal TS. The second amplitude AMP2 of the offset signal OS is greater than the first amplitude AMP1 of the driving signal TS. The offset signal OS is shifted rightward with respect to the driving signal TS. For example, a portion of a low-level period of the offset signal OS overlaps a portion of a high-level period of the driving signal TS.

Figure 11E:
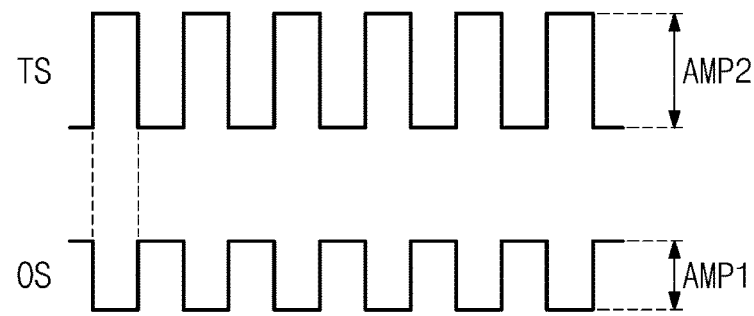

Referring to FIG. 11E, in an embodiment, a phase of the offset signal OS is opposite to a phase of the driving signal TS. The second amplitude AMP2 of the driving signal TS is greater than the first amplitude AMP1 of the offset signal OS.

Figure 11F:
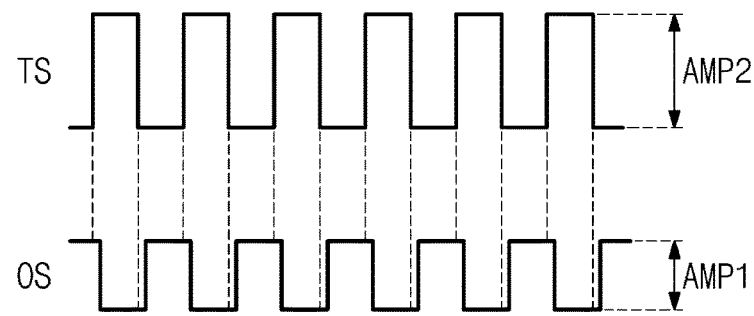

Referring to FIG. 11F, in an embodiment, a phase of the offset signal OS is opposite to a phase of the driving signal TS. The second amplitude AMP2 of the driving signal TS is greater than the first amplitude AMP1 of the offset signal OS. The offset signal OS is shifted rightward with respect to the driving signal TS. For example, a portion of a low-level period of the offset signal OS overlaps a portion of a high-level period of the driving signal TS.

Figure 12:
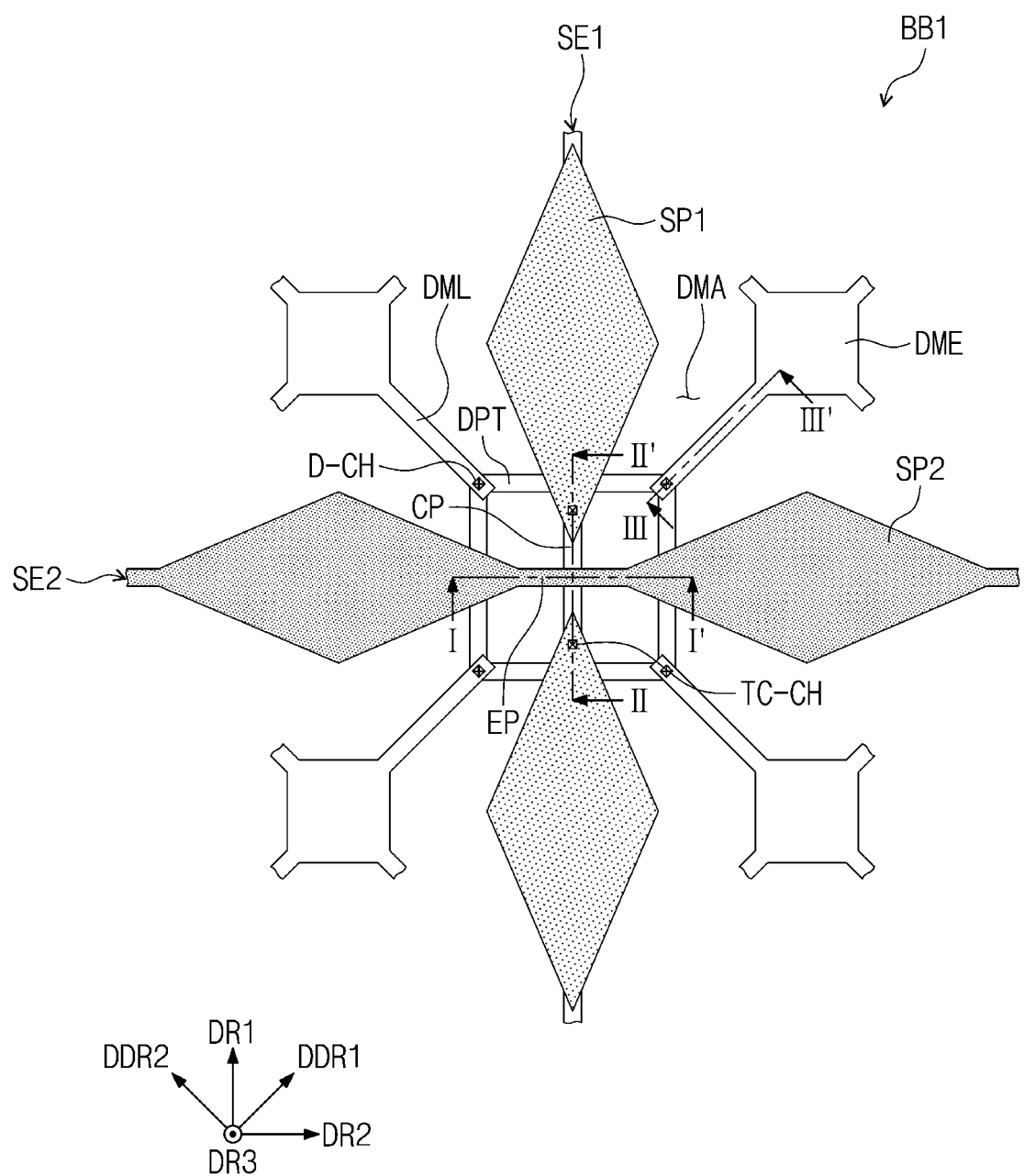
FIG. 12 is an enlarged view of area BB1 illustrated in FIG. 10.

FIG. 12 is an enlarged view of area BB1 illustrated in FIG. 10.

FIGS. 9 and 10 illustrate a structure in which the dummy lines DML appear to pass through intersections of the first sensing electrodes SE1 and the second sensing electrodes SE2 as an example. When the dummy electrodes DME and the dummy lines DML are illustrated in a reduced size, for example, the dummy electrodes DME and the dummy lines DML are illustrated as in FIGS. 9 and 10.

However, substantially, as illustrated in FIG. 12, when the dummy electrodes DME and the dummy lines DML are enlarged, the dummy lines DML can be seen as being connected with each other through dummy connection patterns DPT. Below, the structure of the dummy electrodes DME, the dummy lines DML, and the dummy connection patterns DPT will be described in detail with reference to FIG. 12.

Referring to FIG. 12, in an embodiment, the first sensing electrode SE1 include a pair of first sensing parts SP1 arranged in the first direction DR1 and a connection pattern CP disposed between the first sensing parts SP1 and that connects the first sensing parts SP1.

Figure 13:
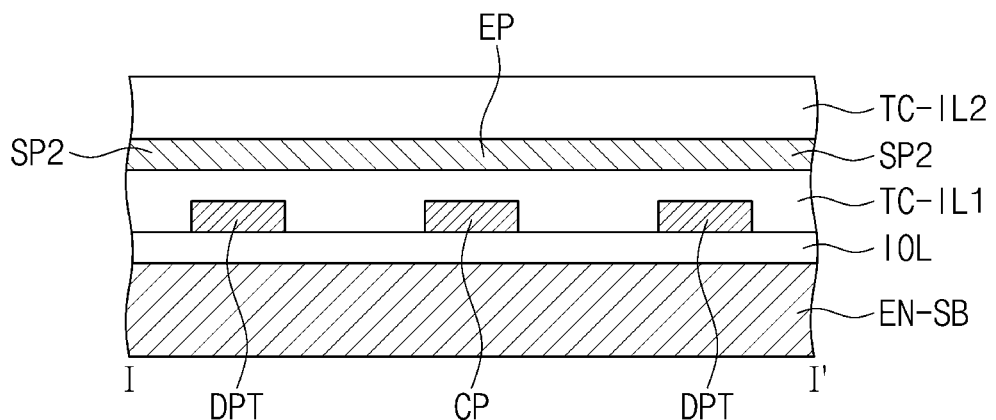
FIG. 13 is a cross-sectional view taken along line I-I' of FIG. 12.
Figure 14:
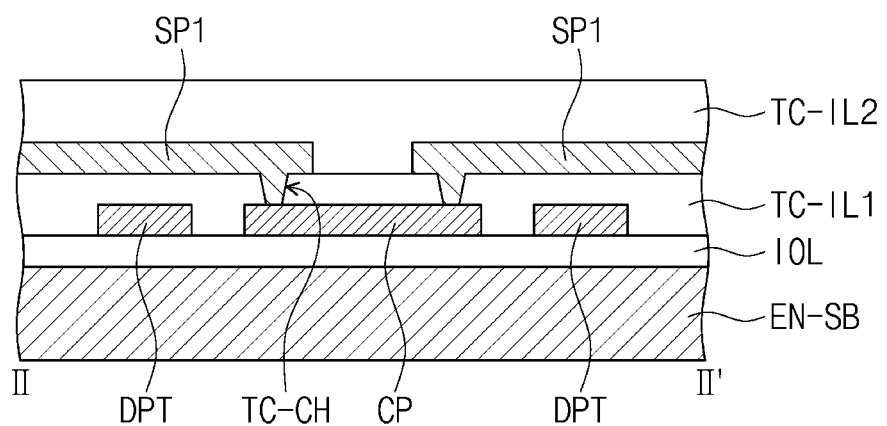
FIG. 14 is a cross-sectional view taken along line II-II' of FIG. 12.
Figure 15:
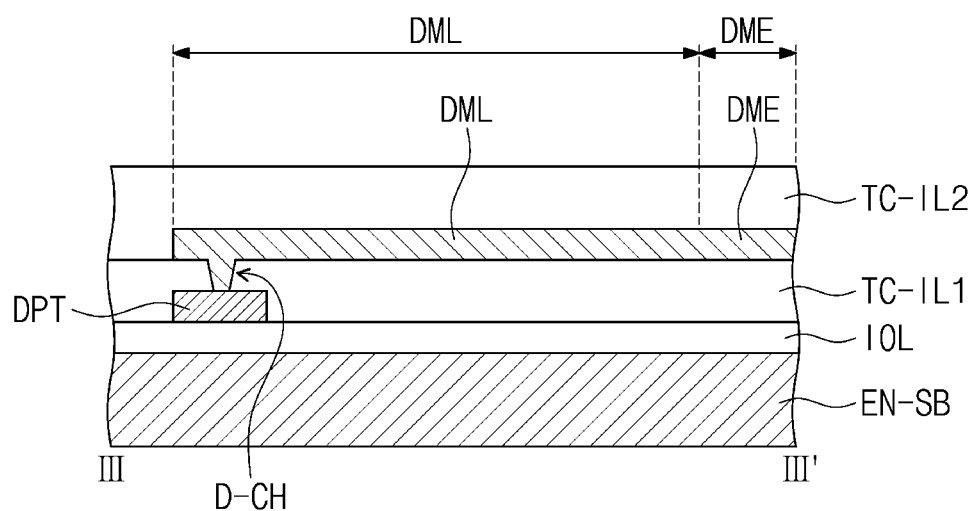
FIG. 15 is a cross-sectional view taken along line III-III' of FIG. 12.

An insulating layer, illustrated in FIGS. 13 to 15, is disposed between the connection pattern CP and the first sensing parts SP1, and the connection pattern CP is connected with the first sensing parts SP1 through contact holes TC-CH formed in the insulating layer. A plurality of the connection patterns CP illustrated in FIG. 12 are provided in the structure shown in FIG. 9 such that the first sensing parts SP1 are connected with each other.

The second sensing electrode SE2 include a pair of second sensing parts SP2 arranged in the second direction DR2 and an extension pattern EP disposed between the second sensing parts SP2 and that extends from the second sensing parts SP2.

The extension pattern EP is insulated from the connection pattern CP and crosses the connection pattern CP. The extension pattern EP is integrally formed with the second sensing parts SP2. A plurality of the extension patterns EP illustrated in FIG. 12 are provided in the structure shown in FIG. 9 to extend from second sensing parts SP2.

The first and second sensing parts SP1 and SP2 are disposed in the same layer as the extension pattern EP. The connection pattern CP is disposed in a different layer from the first and second sensing parts SP1 and SP2 and the extension pattern EP.

The dummy electrodes DME are disposed between the first and second sensing parts SP1 and SP2. The dummy electrodes DME are arranged in the first diagonal direction DDR1 and the second diagonal direction DDR2. In an embodiment, the dummy electrodes DME have a rectangular shape, but embodiments of the present disclosure are not necessarily limited thereto. For example, in some embodiments, the dummy electrodes DME have the shape of a circle, a tower, or a polygon.

Each of the dummy lines DML extends from a corresponding dummy electrode DME in the first diagonal direction DDR1 or the second diagonal direction DDR2. The dummy lines DML are integrally formed with the dummy electrodes DME. The dummy lines DML extend to a crossing of the first sensing electrode SE1 and the second sensing electrode SE2. The crossing of the first sensing electrode SE1 and the second sensing electrode SE2 is the crossing of the connection pattern CP and the extension pattern EP, when viewed in a plan view.

The input sensing part ISP illustrated in FIG. 9 includes the dummy connection pattern DPT illustrated in FIG. 12. The dummy connection pattern DPT is insulated from the first sensing electrode SE1 and the second sensing electrode SE2. The dummy connection pattern DPT cross the first sensing electrode SE1 and the second sensing electrode SE2, when viewed in a plan view. The dummy connection pattern DPT are disposed adjacent to the crossing of the first sensing electrode SE1 and the second sensing electrode SE2.

The dummy electrodes DME are disposed between the first and second sensing parts SP1 and SP2 and are connected with each other. The dummy connection pattern DPT connect the dummy electrodes DME. For example, since the dummy connection pattern DPT is connected with the dummy lines DML that extend from the dummy electrodes DME, the dummy electrodes DME are connected with each other through the dummy connection pattern DPT.

An insulating layer, illustrated in FIGS. 13 to 15, is disposed between the dummy connection pattern DPT and the dummy lines DML, and the dummy connection pattern DPT are connected with the dummy lines DML through contact holes D-CH formed in the insulating layer.

According to an above connection structure, the dummy electrodes DME are connected with each other in the first diagonal direction DDR1 and the second diagonal direction DDR2. A plurality of the dummy connection pattern DPT illustrated in FIG. 12 are provided in the structure shown in FIG. 9 such that the dummy electrodes DME are connected with each other.

When viewed in a plan view, the dummy connection pattern DPT do not overlap the connection pattern CP and the extension pattern EP. The dummy connection pattern DPT are adjacent to the connection pattern CP and the extension pattern EP, when viewed in a plan view. The dummy connection pattern DPT crosses the first sensing parts SP1 and the second sensing parts SP2. For example, the dummy connection pattern DPT cross portions of the first and second sensing parts SP1 and SP2 that are adjacent to the connection pattern CP and the extension pattern EP.

The dummy connection pattern DPT has a shape of a closed rectangular loop. However, embodiments of the present disclosure are not necessarily limited thereto. For example, in some embodiments, the dummy connection pattern DPT has a shape of a circle, a polygon, or an ellipse. The dummy connection pattern DPT surrounds the connection pattern CP and the extension pattern EP.

The dummy electrodes DME and the dummy lines DML are disposed in the same layer as the first and second sensing parts SP1 and SP2 and the extension pattern EP. The dummy connection pattern DPT is disposed in the same layer as the connection pattern CP.

Referring to FIGS. 9 and 12, in an embodiment, since the dummy electrodes DME are disposed in the dummy areas DMA, which are unused spaces located between the first and second sensing parts SP1 and SP2, the space is efficiently utilized. In addition, electromagnetic shielding is efficiently performed by using the previously unused space to dispose the plurality of dummy electrodes DME in the active area AA.

FIG. 13 is a cross-sectional view taken along line I-I' of FIG. 12. FIG. 14 is a cross-sectional view taken along line II-II' of FIG. 12. FIG. 15 is a cross-sectional view taken along line III-III' of FIG. 12.

Referring to FIGS. 13, 14, and 15, in an embodiment, the insulating layer IOL is disposed on the encapsulation substrate EN-SB. The connection pattern CP and the dummy connection pattern DPT are disposed on the insulating layer IOL. The connection pattern CP and the dummy connection pattern DPT are formed from the first conductive layer CPT1 illustrated in FIG. 7. The first insulating layer TC-IL1 is disposed on the insulating layer IOL and covers the connection pattern CP and the dummy connection pattern DPT.

The first and second sensing parts SP1 and SP2, the extension pattern EP, the dummy line DML, and the dummy electrode DME are disposed on the first insulating layer TC-IL1. The first and second sensing parts SP1 and SP2, the extension pattern EP, the dummy line DML, and the dummy electrode DME are formed from the second conductive layer CPT2 illustrated in FIG. 7. The connection pattern CP and the dummy connection pattern DPT are disposed below the first and second sensing parts SP1 and SP2, the extension pattern EP, the dummy line DML, and the dummy electrode DME.

The first sensing parts SP1 are connected with the connection pattern CP through the contact holes TC-CH formed in the first insulating layer TC-IL1. Accordingly, the first sensing parts SP1 are connected with each other by the connection pattern CP.

The dummy line DML is connected with the dummy connection pattern DPT through the contact holes D-CH formed in the first insulating layer TC-IL1. Accordingly, the dummy electrode DME is connected with the dummy connection patterns DPT through the dummy line DML.

The second insulating layer TC-IL2 may be disposed on first insulating layer TC-IL1 and covers the first and second sensing pans SP1 and SP2, the extension pattern EP, the dummy line DML, and the dummy electrode DME.

Figure 16A:
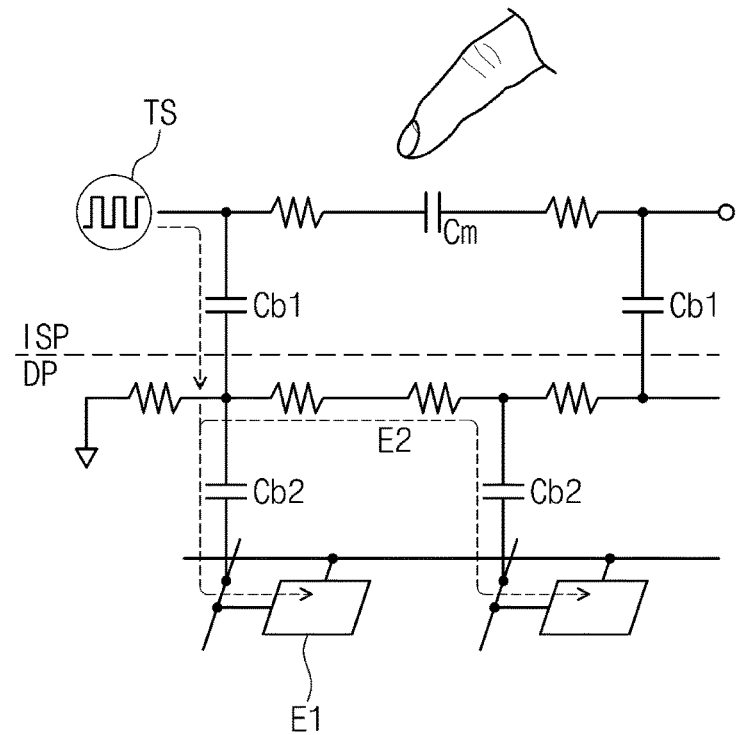
FIGS. 16A and 16B are circuit diagrams that illustrate an offset operation of an electromagnetic signal of an input sensing part illustrated in FIG. 9.
Figure 16B:
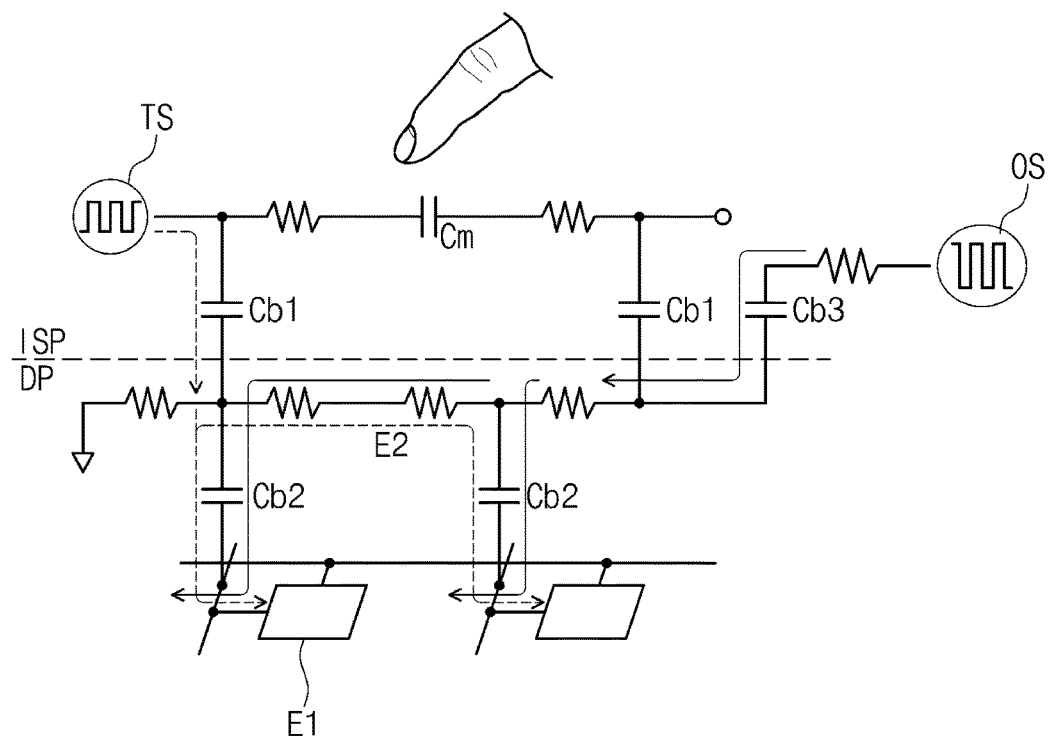

FIGS. 16A and 16B are circuit diagrams that illustrate an offset operation of an electromagnetic signal of an input sensing part illustrated in FIG. 9.

FIGS. 16A and 16B will be described together with reference to FIGS. 9 and 10.

Referring to FIGS. 9, 10, 16A, and 16B, in an embodiment, the input sensing part ISP includes a capacitor Cm formed by the first and second sensing electrodes SE1 and SE2. Resistors are shown that correspond to the first and second sensing electrodes SE1 and SE2.

First parasitic capacitors $C_{b1}$ are formed in the input sensing part ISP. The first parasitic capacitors $C_{b1}$ are formed by a conductor of the display panel DP and a conductor of the input sensing pan ISP. For example, the conductor of the input sensing part ISP is the first and second sensing electrodes SE1 and SE2, and the conductor of the display panel DP is a second electrode E2.

Second parasitic capacitors $C_{b2}$ are formed in the display panel DP. The second parasitic capacitors $C_{b2}$ are formed by conductors in the display panel DP. For example, the second parasitic capacitors $C_{b2}$ are formed by lines connected with the first electrode E1 and the second electrode E2.

Referring to FIG. 16A, in an embodiment, when the driving signal TS is applied to the input sensing part ISP, an electromagnetic signal, illustrated by a dotted arrow, associated with the driving signal TS is applied to the first electrodes E1 of the display panel DP through the first and second parasitic capacitors Cb1 and Cb2. The electromagnetic signal of the driving signal TS acts as noise to the display panel DP. For example, the display panel DP might not operate normally.

Referring to FIGS. 9, 10, and 16B, the input sensing part ISP further includes a third parasitic capacitor Cb3 formed by the dummy electrodes DME and the conductor of the display panel DP. Resistors that correspond to the dummy electrodes DME are illustrated together with the third parasitic capacitor Cb3.

The electromagnetic signal of the driving signal TS is applied to the first electrodes E1 of the display panel OP through the first and second parasitic capacitors Cb1 and Cb2. An electromagnetic signal, illustrated by a solid arrow, of the offset signal OS is applied to the first electrodes E1 of the display panel DP through the third parasitic capacitor Cb3 formed by the dummy electrodes DME and the second parasitic capacitors Cb2 of the display panel DP.

Accordingly, the electromagnetic signal of the driving signal TS is cancelled out by the offset signal OS whose phase is opposite to the phase of the driving signal TS. As such, an electromagnetic signal applied to the display panel DP is attenuated. For example, the display panel DP operates normally.

Figure 17:
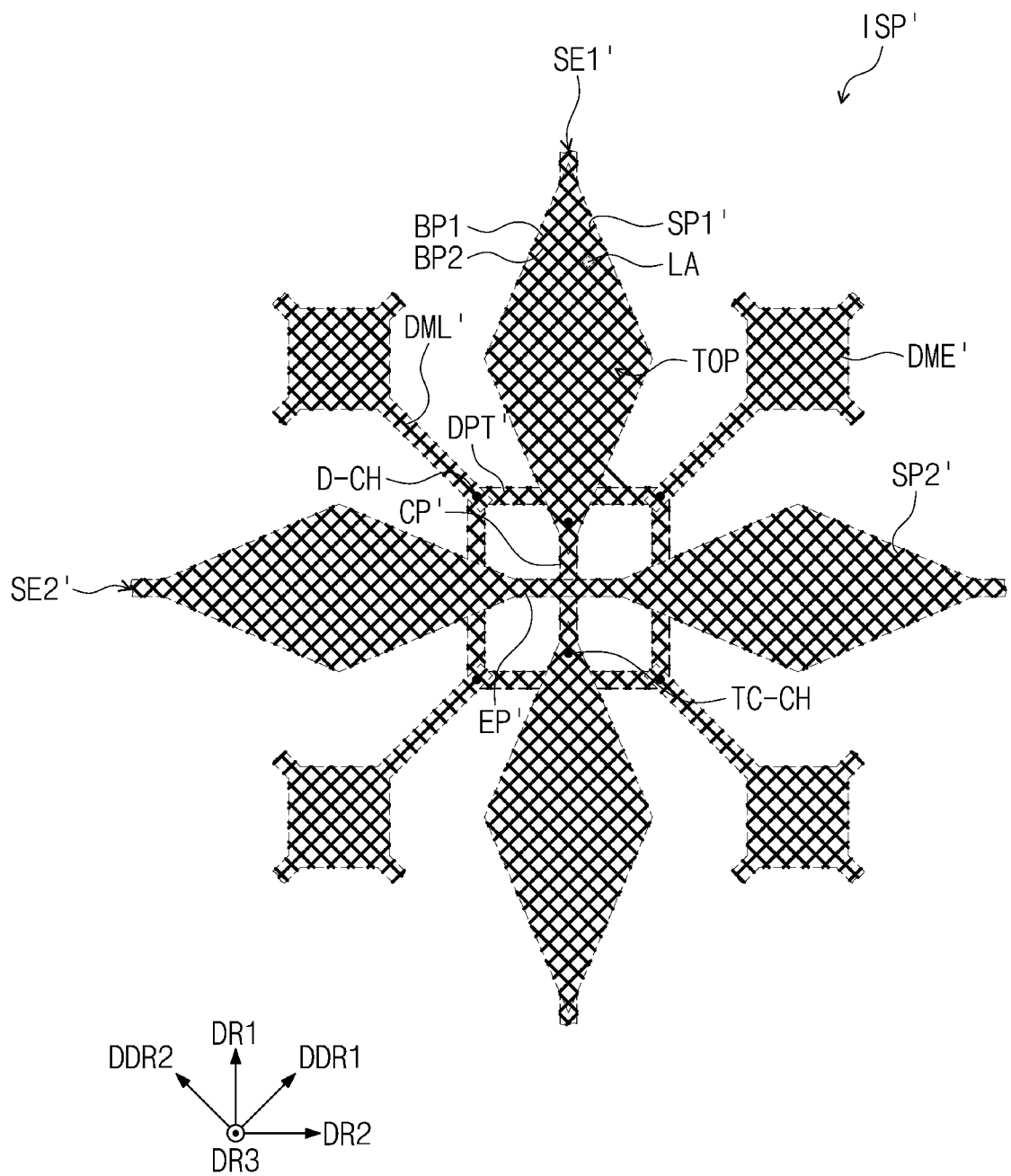
FIG. 17 illustrates a structure of first and second sensing parts, dummy electrodes, dummy lines, and dummy connection patterns of an input sensing part illustrated in FIG. 5.

FIG. 17 illustrates a structure of first and second sensing parts, dummy electrodes, dummy lines, and dummy connection patterns of an input sensing part illustrated in FIG. 5.

In an embodiment, FIG. 17 is a plan view that corresponds to FIG. 12.

Referring to FIG. 17, in an embodiment, a plurality of structures or configurations illustrated in FIG. 17 are provided in the input sensing pan ISP'. The input sensing part ISP' includes first and second sensing electrode SE1' and SE2', dummy electrodes DME', dummy lines DML', and a dummy connection pattern DPT'. The first and second sensing electrode SE1' and SE2', the dummy electrodes DME', the dummy lines DML', and the dummy connection pattern DPT' are disposed on the thin film encapsulation layer TFE illustrated in FIGS. 5 and 8.

The first and second sensing electrode SE1' and SE2', the dummy electrodes DME', the dummy lines DML', and the dummy connection pattern DPT' have a mesh shape. For example, each of the first and second sensing electrode SE1' and SE2', the dummy electrodes DME', the dummy lines DML', and the dummy connection pattern DPT' include a plurality of first branch portions BP1 that extend in the first diagonal direction DDR1 and a plurality of second branch portions BP2 that extend in the second diagonal direction DDR2. In an embodiment, boundaries of the first and second sensing electrode SE1' and SE2', the dummy electrodes DME', the dummy lines DML', and the dummy connection pattern DPT' are illustrated by a dotted line.

The first branch portions BP1 and the second branch portions BP2 of each of the first and second sensing electrode SE1' and SE2', the dummy electrodes DME', the dummy lines DML', and the dummy connection pattern DPT' intersect with each other and are integrally formed. Rhombus-shaped touch openings TOP are formed by the first branch portions BP1 and the second branch portions BP2.

A connection pattern CP' of the first sensing electrode SE1' is formed from the first conductive layer CPT1 illustrated in FIG. 8. The first and second sensing electrode SE1' and SE2', an extension pattern EP', the dummy lines DML', and the dummy connection pattern DPT' are formed from the second conductive layer CPT2 illustrated in FIG. 8.

When viewed in a plan view, each of the touch openings TOP overlaps the light-emitting area LA illustrated in FIG. 8. Accordingly, when viewed in a plan view, the light-emitting elements OLED overlap each respective touch opening TOP. When viewed in a plan view, the first and second branch portions BP1 and BP2 overlap the non-light-emitting area NLA illustrated in FIG. 8. Because the first and second branch portions BP1 and BP2 are disposed in the non-light-emitting area NLA, light emitted by the light-emitting area LA is not affected by the first and second branch portions BP1 and BP2 and is output normally.

Except for the mesh shape, the first and second sensing electrode SE1' and SE2', the dummy electrodes DME', the dummy lines DML', and the dummy connection pattern DPT' are identical in structure to the first and second sensing electrodes SE1 and SE2, the dummy electrodes DME, the dummy lines DML, and the dummy connection pattern DPT illustrated in FIG. 12.

Figure 18:
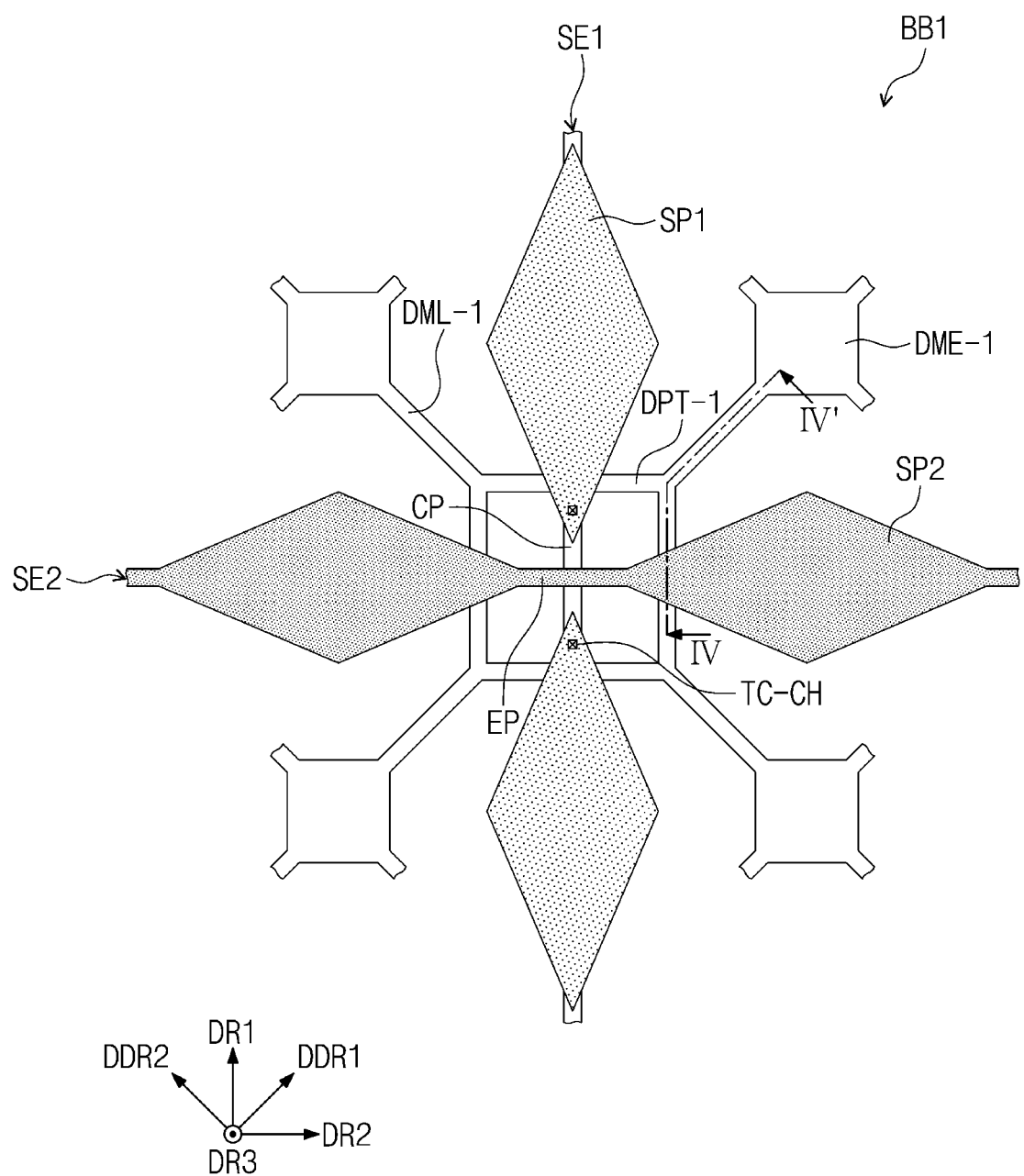
FIG. 18 illustrates a structure of dummy electrodes, dummy lines, and a dummy connection pattern according to an embodiment of the present disclosure.
Figure 19:
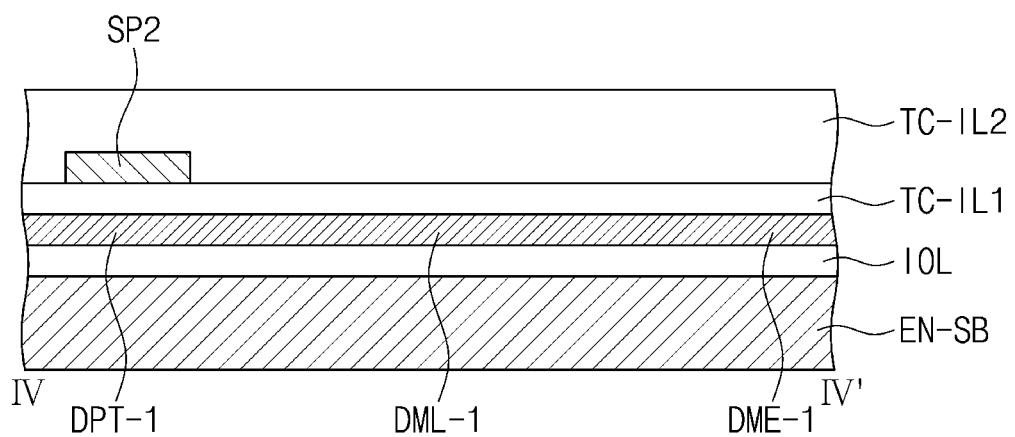
FIG. 19 is a cross-sectional view taken along line IV-IV' of FIG. 18.

FIG. 18 illustrates a structure of dummy electrodes, dummy lines, and a dummy connection pattern according to an embodiment of the present disclosure. FIG. 19 is a cross-sectional view taken along line IV-IV' of FIG. 18.

In an embodiment, FIG. 18 is a plan view that corresponds to FIG. 12. The first and second sensing electrodes SE1 and SE2 illustrated in FIG. 18 may be identical in structure to the first and second sensing electrodes SE1 and SE2 illustrated in FIG. 12. Accordingly, below, structures of dummy electrodes DME-1, dummy lines DML-1, and a dummy connection pattern DPT-1 illustrated in FIG. 18 will be mainly described.

Referring to FIGS. 18 and 19, in an embodiment, the first and second sensing parts SP1 and SP2 and the extension pattern EP are disposed in the same layer, and the connection pattern CP is disposed in a different layer from the first and second sensing parts SP1 and SP2.

The dummy electrodes DME-1, the dummy lines DML-1, and the dummy connection pattern DPT-1 are disposed in a different layer from the first and second sensing parts SP1 and SP2. The dummy electrodes DME-1, the dummy lines DML-1, and the dummy connection pattern DPT-1 are disposed in the same layer as the connection pattern CP.

The dummy electrodes DME-1, the dummy lines DML-1, and the dummy connection pattern DPT-1 are disposed below the first and second sensing parts SP1 and SP2. The dummy electrodes DME-1, the dummy lines DML-1, and the dummy connection pattern DPT-1 are integrally formed.

Figure 20:
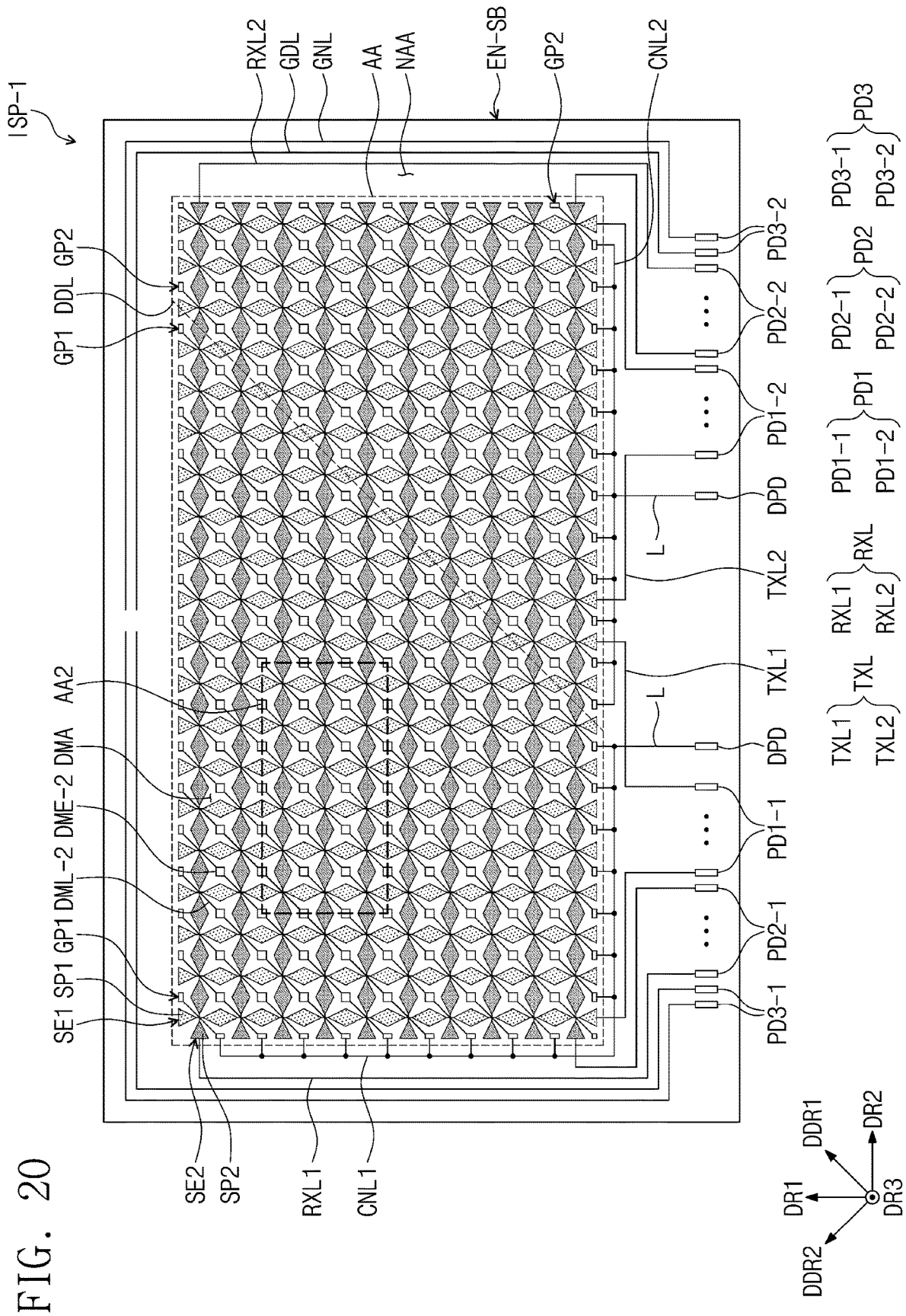
FIG. 20 illustrates a structure of an input sensing part according to an embodiment of the present disclosure.
Figure 21:
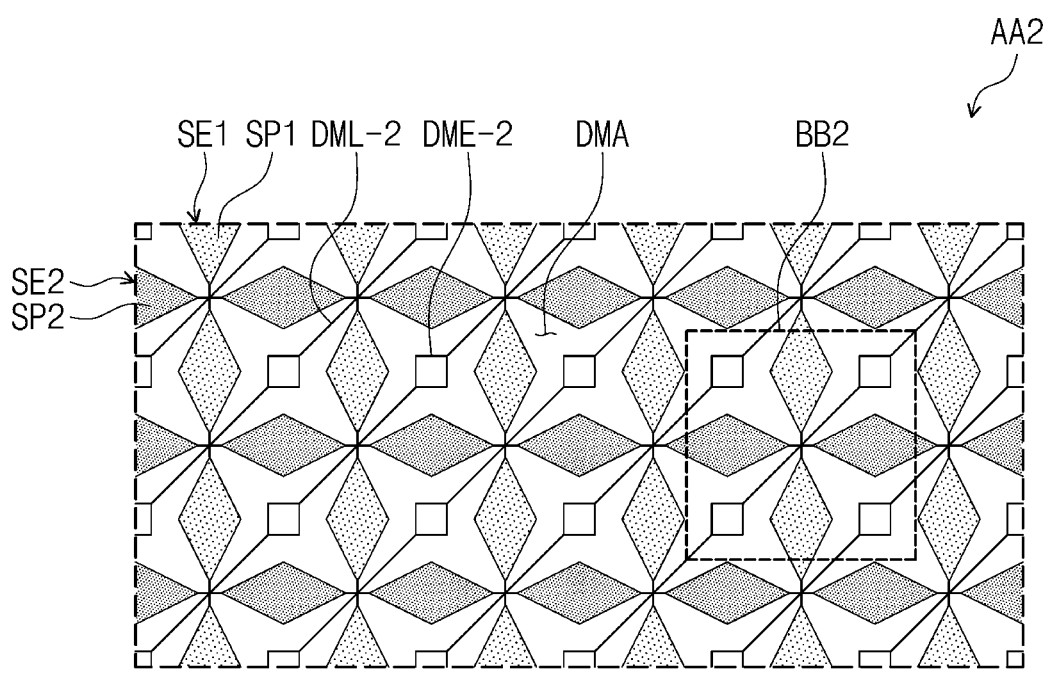
FIG. 21 is an enlarged view of area AA2 illustrated in FIG. 20.
Figure 21:
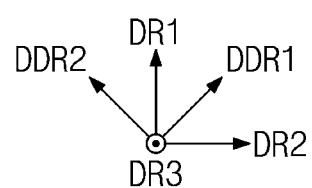
Figure 22:
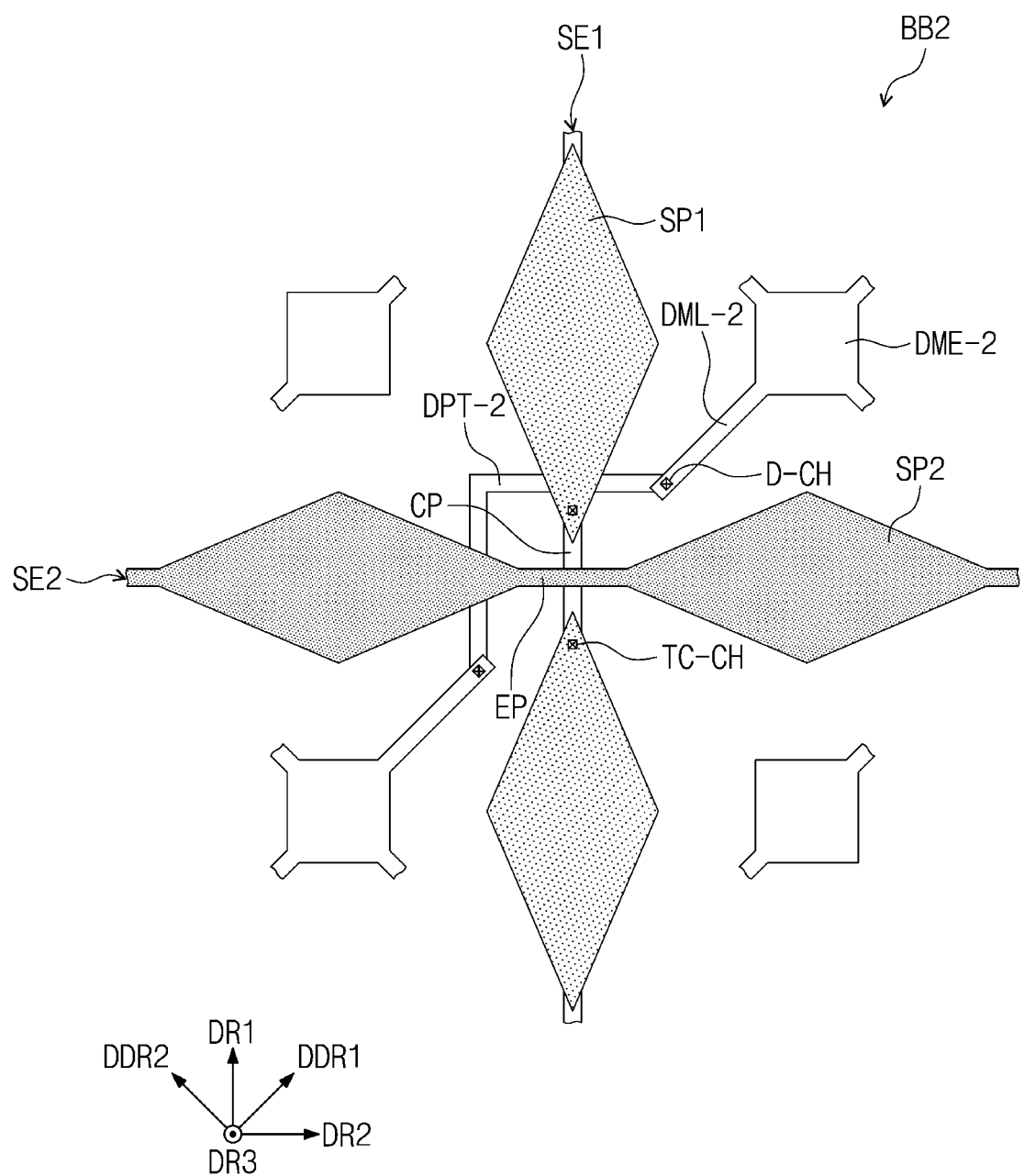
FIG. 22 is an enlarged view of area BB2 illustrated in FIG. 21.

FIG. 20 illustrates a structure of an input sensing part according to an embodiment of the present disclosure. FIG. 21 is an enlarged view of area AA2 illustrated in FIG. 20. FIG. 22 is an enlarged view of area BB2 illustrated in FIG. 21.

In an embodiment, FIG. 20 is a plan view that corresponds to FIG. 9, FIG. 21 is a plan view that corresponds to FIG. 10, and FIG. 22 is a plan view that corresponds to FIG. 12. The first and second sensing electrodes SE1 and SE2 illustrated in FIGS. 20 and 21 are identical in structure to the first and second sensing electrodes SE1 and SE2 illustrated in FIGS. 9 and 10. Accordingly, below, structures of dummy electrodes DME-2, dummy lines DML-2, and a dummy connection pattern DPT-2 of an input sensing part ISP-1 illustrated in FIG. 20 and FIG. 21 will be mainly described.

Referring to FIGS. 20 and 21, in an embodiment, the dummy electrodes DME-2 are arranged in the first diagonal direction DDR1. The dummy lines DML-2 extend from the dummy electrodes DME-2, respectively. The dummy lines DML-2 extend in the first diagonal direction DDR1.

The dummy electrodes DME-2 and the dummy lines DML-2 are divided into the first group GP1 and the second group GP2. The first group GP1 and the second group GP2 are separately defined on the left side and the right side with respect to an arbitrary diagonal line DDL defined in the active area AA. The dummy electrodes DME-2 and the dummy lines DML-2 in the first group GP1 are separated from the dummy electrodes DME-2 and the dummy lines DML-2 in the second group GP2.

The dummy electrodes DME-2 and the dummy lines DML-2 in the first group GP1 are connected with each other. For example, dummy electrodes DME-2 of the first group GP1 disposed on the leftmost side and the uppermost side are connected with each other by a first connection line CNL1. The dummy electrodes DME-2 and the dummy lines DML-2 in the first group GP1 are connected with each other by the first connection line CNL1.

The first connection line CNL1 is connected with a corresponding dummy pad DPD of the dummy pads DPD through a corresponding line "L" of the lines "L". The first connection line CNL1 is insulated from the first and second sensing lines TXL and RXL and crosses the first and second sensing lines TXL and RXL.

The dummy electrodes DME-2 and the dummy lines DML-2 in the second group GP2 are connected with each other. For example, dummy electrodes DME-2 of the second group GP2 disposed on the lowermost side and the rightmost side are connected with each other by a second connection line CNL2. The dummy electrodes DME-2 and the dummy lines DML-2 in the second group GP2 are connected with multi other by the second connection line CNL2.

The second connection line CNL2 is connected with a corresponding dummy pad DPD of the dummy pads DPD through a corresponding line "L" of the lines "L". The second connection line CNL2 are insulated from the first sensing lines TXL and cross the first sensing lines TXL.

The dummy electrodes DME-2 and the dummy lines DML-2 are also connected with each other by dummy connection patterns, which will be described in detail with reference to FIG. 22.

Referring to FIG. 22, in an embodiment, the dummy electrodes DME-2 are disposed between the first and second sensing parts SP1 and SP2 and are arranged in the first diagonal direction DDR1. The dummy lines DML-2 respectively extend from the dummy electrodes DME-2 in the first diagonal direction DDR1 and are integrally formed with the dummy electrodes DME-2. The dummy lines DML-2 extend to a crossing of the first sensing electrode SE1 and the second sensing electrode SE2.

The dummy connection pattern DPT-2 are disposed adjacent to the crossing of the first sensing electrode SE1 and the second sensing electrode SE2. The dummy connection pattern DPT-2 crosses the first sensing electrode SE1 and the second sensing electrode SE2.

When viewed in a plan view, the dummy connection pattern DPT-2 cross a pair of an adjacent first sensing part SP1 and second sensing part SP2. For example, the dummy connection pattern DPT has an "L" shape that is vertically inverted, and crosses the first sensing part SP1 and the second sensing part SP2.

Since the dummy connection pattern DPT-2 is connected with the dummy lines DML-2 that extend from the dummy electrodes DME-2, the dummy electrodes DME-2 are connected with each other through the dummy connection pattern DPT-2. According to an above connection structure, the dummy electrodes DME-2 are connected with each other in the first diagonal direction DDR1.

When viewed in a plan view, the dummy connection pattern DPT-2 do not overlap the connection pattern CP and the extension pattern EP, but are adjacent to the connection pattern CP and the extension pattern EP. The dummy connection pattern DPT-2 cross portions of the first and second sensing parts SP1 and SP2 that are adjacent to the connection pattern CP and the extension pattern EP.

Figure 23:
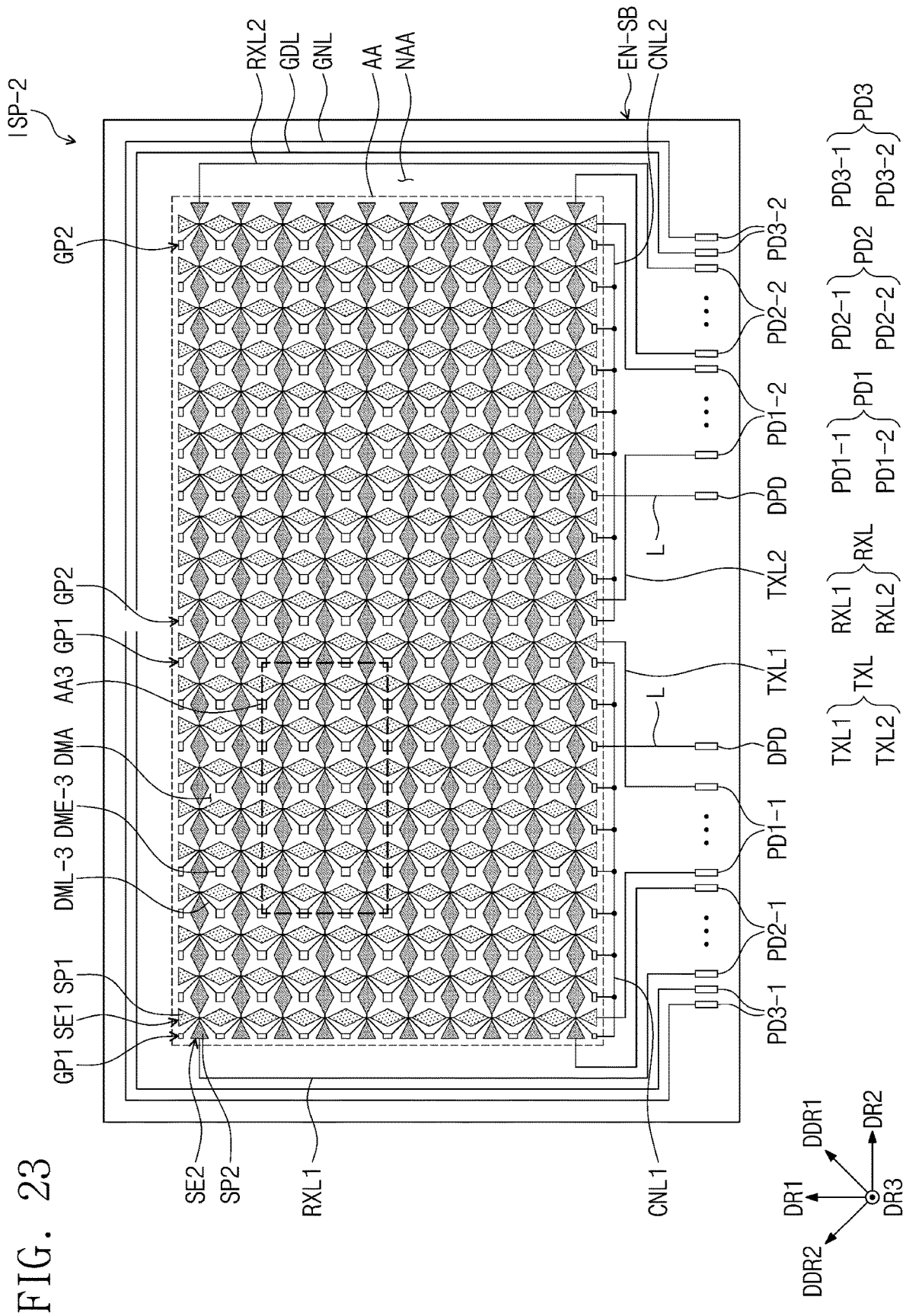
FIG. 23 illustrates a structure of an input sensing part according to an embodiment of the present disclosure.
Figure 24:
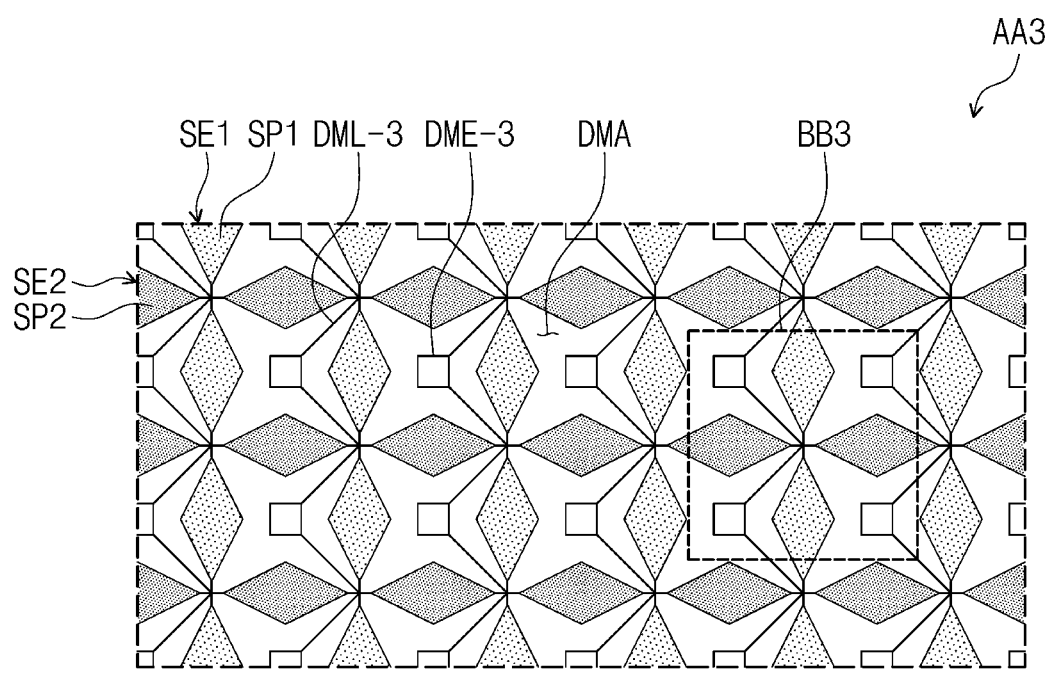
FIG. 24 is an enlarged view of area AA3 illustrated in FIG. 23.
Figure 24:
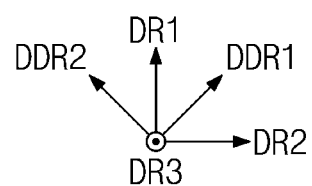
Figure 25:
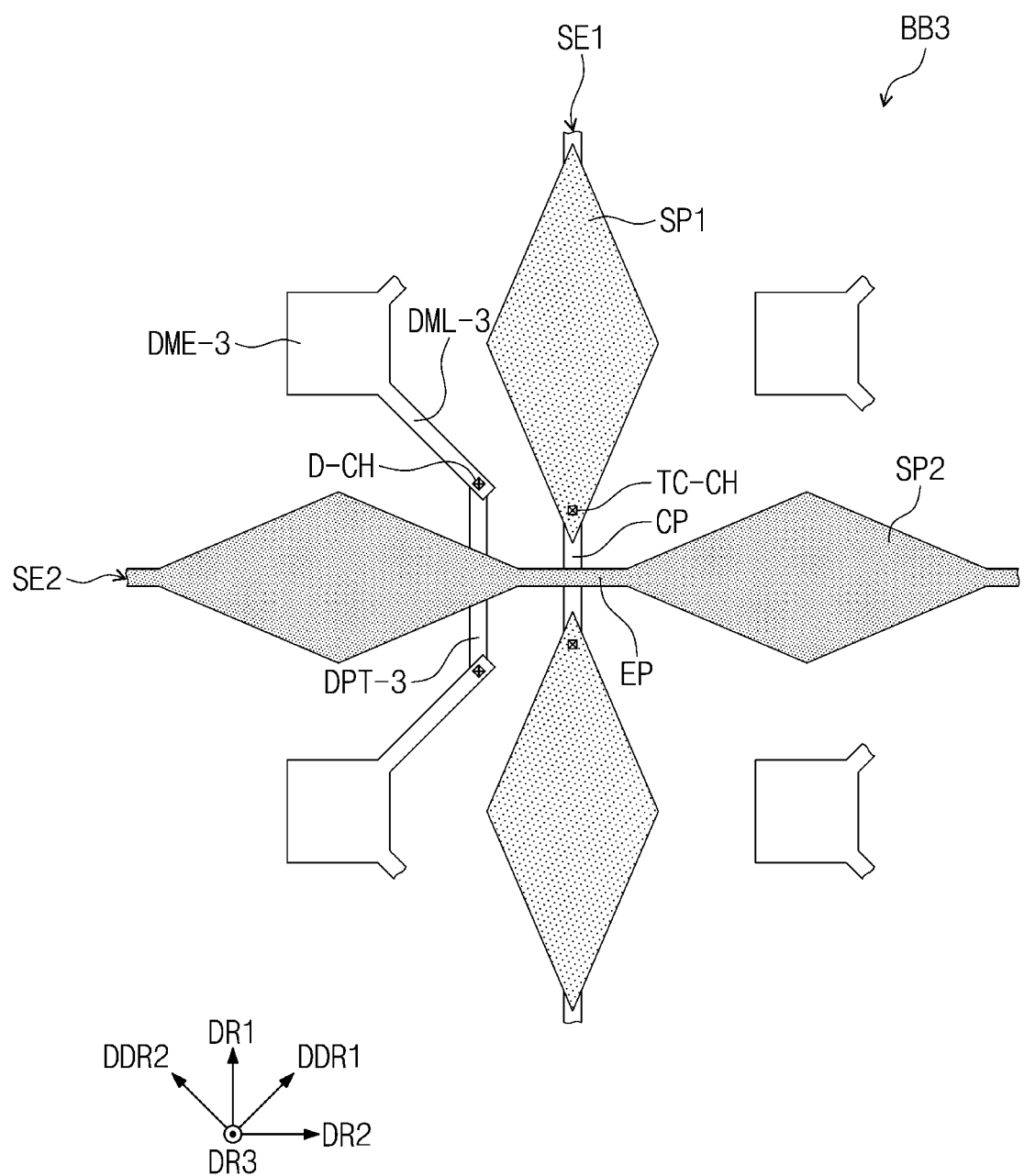
FIG. 25 is an enlarged view of area BB3 illustrated in FIG. 24.

FIG. 23 illustrates a structure of an input sensing part according to an embodiment of the present disclosure. FIG. 24 is an enlarged view of area AA3 illustrated in FIG. 23. FIG. 25 is an enlarged view of area BB3 illustrated in FIG. 24.

In an embodiment, FIG. 23 is a plan view that corresponds to FIG. 9, FIG. 24 is a plan view that corresponds to FIG. 10, and FIG. 25 is a plan view that corresponds to FIG. 12. The first and second sensing electrodes SE1 and SE2 illustrated in FIGS. 23 and 24 are identical in structure to the first and second sensing electrodes SE1 and SE2 illustrated in FIGS. 9 and 10. Accordingly, below, structures of dummy electrodes DME-3, dummy lines DML-3, and a dummy connection pattern DPT-3 of an input sensing part ISP-2 illustrated in FIG. 23 and FIG. 24 will be mainly described.

Referring to FIGS. 23 and 24, in an embodiment, the dummy electrodes DME-3 are arranged in the first direction DR1. The dummy lines DML-3 extend from the dummy electrodes DME-3 in the first and second diagonal directions DDR 1 and DDR2.

The dummy electrodes DME-3 and the dummy lines DML-3 are divided into the first group GP1 and the second group GP2. The first group GP1 and the second group GP2 are separately defined on the left side and the right side with respect to the center of the active area AA. The dummy electrodes DME-3 and the dummy lines DML-3 in the first group GP1 are separated from the dummy electrodes DME-3 and the dummy lines DML-3 in the second group GP2.

The dummy electrodes DME-3 and the dummy lines DML-3 in the first group GP1 are connected with each other. For example, dummy electrodes DME-3 in the first group GP1 disposed on the lowermost side are connected with each other by the first connection line CNL1. The dummy electrodes DME-3 and the dummy lines DML-3 in the first group GP1 may be integrally connected with each other by the first connection line CNL1.

The first connection line CNL1 is insulated from the first sensing lines TXL and crosses the first sensing lines TXL. The first connection line CNL1 is connected with a corresponding dummy pad DPD of the dummy pads DPD through a corresponding line "L" of the lines "L".

The dummy electrodes DME-3 and the dummy lines DML-3 in the second group GP2 are connected with each other. For example, dummy electrodes DME-3 in the second group GP2 disposed on the lowermost side are connected with each other by the second connection line CNL2. The dummy electrodes DME-3 and the dummy lines DML-3 in the second group GP2 are connected with each other by the second connection line CNL2.

The second connection line CNL2 are insulated from the first sensing lines TXL and cross the first sensing lines TXL. The second connection line CNL2 are connected with a corresponding dummy pad DPD of the dummy pads DPD through a corresponding line "L" of the lines "L".

The dummy electrodes DME-3 and the dummy lines DML-3 are also connected with each other by dummy connection patterns, which will be described in detail with reference to FIG. 25.

Referring to FIG. 25, in an embodiment, the dummy electrodes DME-3 are disposed between the first and second sensing parts SP1 and SP2 and are arranged in the first direction DR1. The dummy lines DML-3 extend from the dummy electrodes DME-3 in the first and second diagonal directions DDR1 and DDR2. For example, the dummy lines DML-3 extend in the first and second diagonal directions DDR1 and DDR2 from opposite corners of one side of the dummy electrode DME-3 that is parallel in the first direction DR1.

The dummy lines DML-3 are integrally formed with the dummy electrodes DME-3 and extend to a crossing of the first sensing electrode SE1 and the second sensing electrode SE2. The dummy connection pattern DPT-3 extends in the first direction DR1 and is disposed adjacent to the crossing of the first sensing electrode SE1 and the second sensing electrode SE2. When viewed in a plan view, the dummy connection pattern DPT-3 crosses a portion of one of the second sensing parts SP2.

Since the dummy connection pattern DPT-3 is connected with the dummy lines DML-3 that extend from the dummy electrodes DME-3, the dummy electrodes DME-3 are connected with each other through the dummy connection pattern DPT-3. According to an above connection structure, the dummy electrodes DME-3 are connected with each other in the first direction DR1.

When viewed in a plan view, the dummy connection pattern DPT-3 do not overlap the connection pattern CP and the extension pattern EP but are adjacent to the connection pattern CP and the extension pattern EP. The dummy connection pattern DPT-3 crosses a portion of the second sensing part SP2 that is adjacent to the connection pattern CP and the extension pattern EP.

Figure 26:
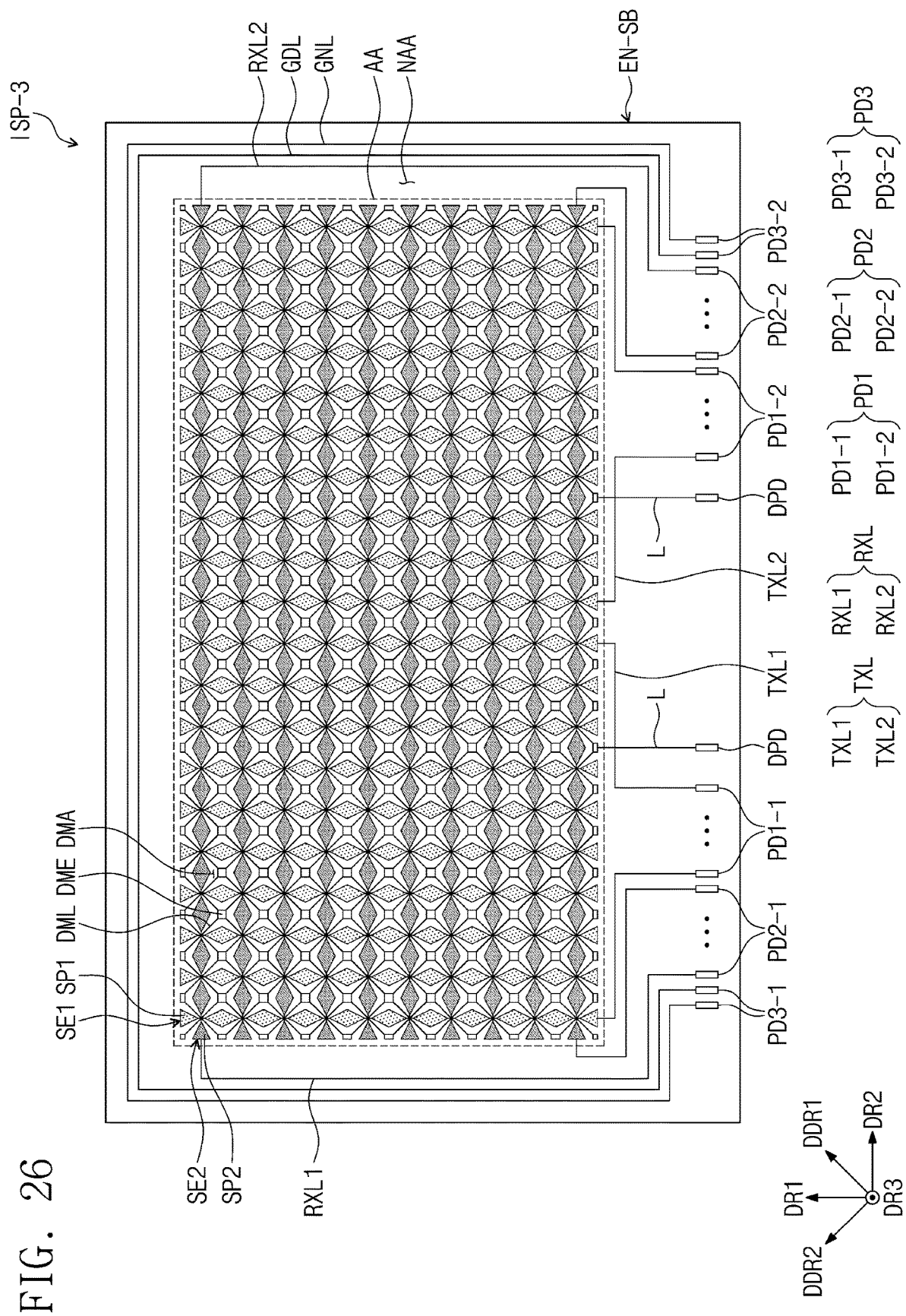
FIG. 26 illustrates a structure of an input sensing part according to an embodiment of the present disclosure.

FIG. 26 illustrate a structure of an input sensing part according to an embodiment of the present disclosure.

In an embodiment, FIG. 26 is a plan view that corresponds to FIG. 9. Below, a structure of an input sensing part ISP-3 will be described based on a difference with the input sensing part ISP illustrated in FIG. 9.

Referring to FIG. 26, in an embodiment, the input sensing part ISP-3 includes the dummy electrodes DME and the dummy lines DML. The dummy electrodes DME and the dummy lines DML illustrated in FIG. 26 are identical in structure to the dummy electrodes DME and the dummy lines DML illustrated in FIG. 9.

In FIG. 9, the dummy electrodes DME and the dummy lines DML are divided into the first group GP1 and the second group GP2. In contrast, in FIG. 26, the dummy electrodes DME and the dummy lines DML are not divided into the first group GP1 and the second group GP2. All the dummy electrodes DME and all the dummy lines DML disposed in the active area AA are connected. A plurality of the dummy connection patterns DPT illustrated in FIG. 12 are provided in the structure shown in FIG. 26 such that the dummy electrodes DME and the dummy lines DML are connected.

Figure 27:
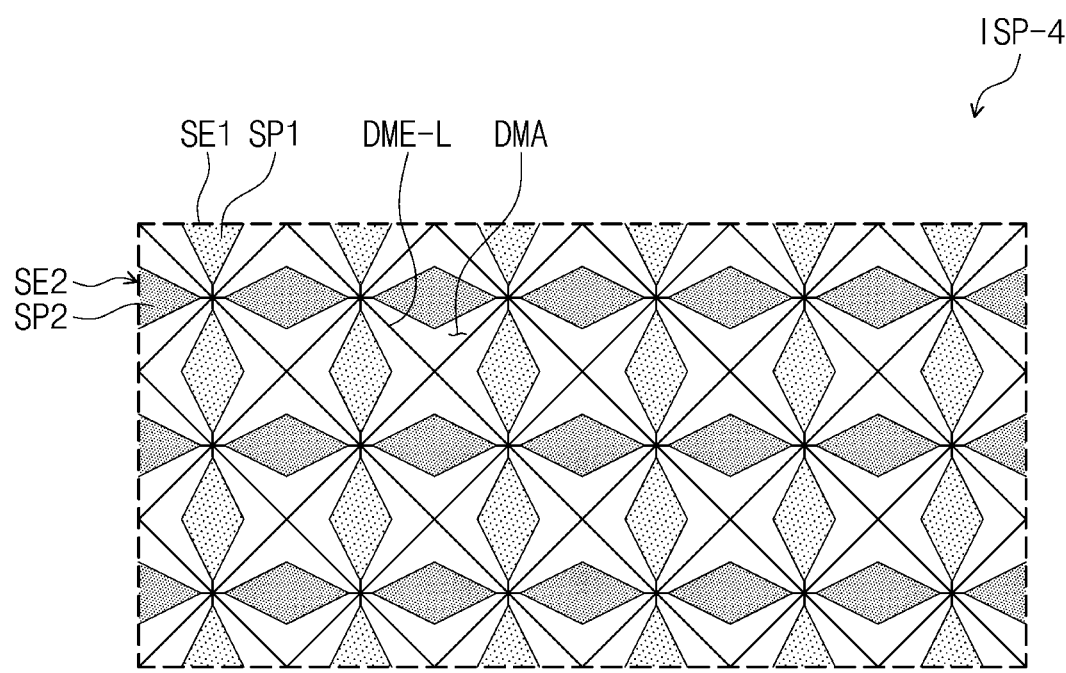
FIG. 27 is a plan view of a portion of an input sensing part according to an embodiment of the present disclosure.
Figure 27:
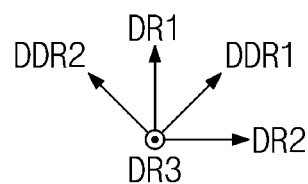

FIG. 27 is a plan view of a portion of an input sensing part according to an embodiment of the present disclosure.

In an embodiment, FIG. 27 is a plan view that corresponds to FIG. 10. Below, a structure of an input sensing part ISP-4 illustrated in FIG. 27 will be described based on a difference with the input sensing part ISP illustrated in FIG. 10.

Referring to FIG. 27, in an embodiment, dummy electrodes DME-L extend in a line shape. The line shape is a shape in which a line extends with a given width. The dummy electrodes DME-L extend in the first diagonal direction DDR1 and the second diagonal direction DDR2 in the line shape between the first and second sensing parts SP1 and SP2.

Figure 28:
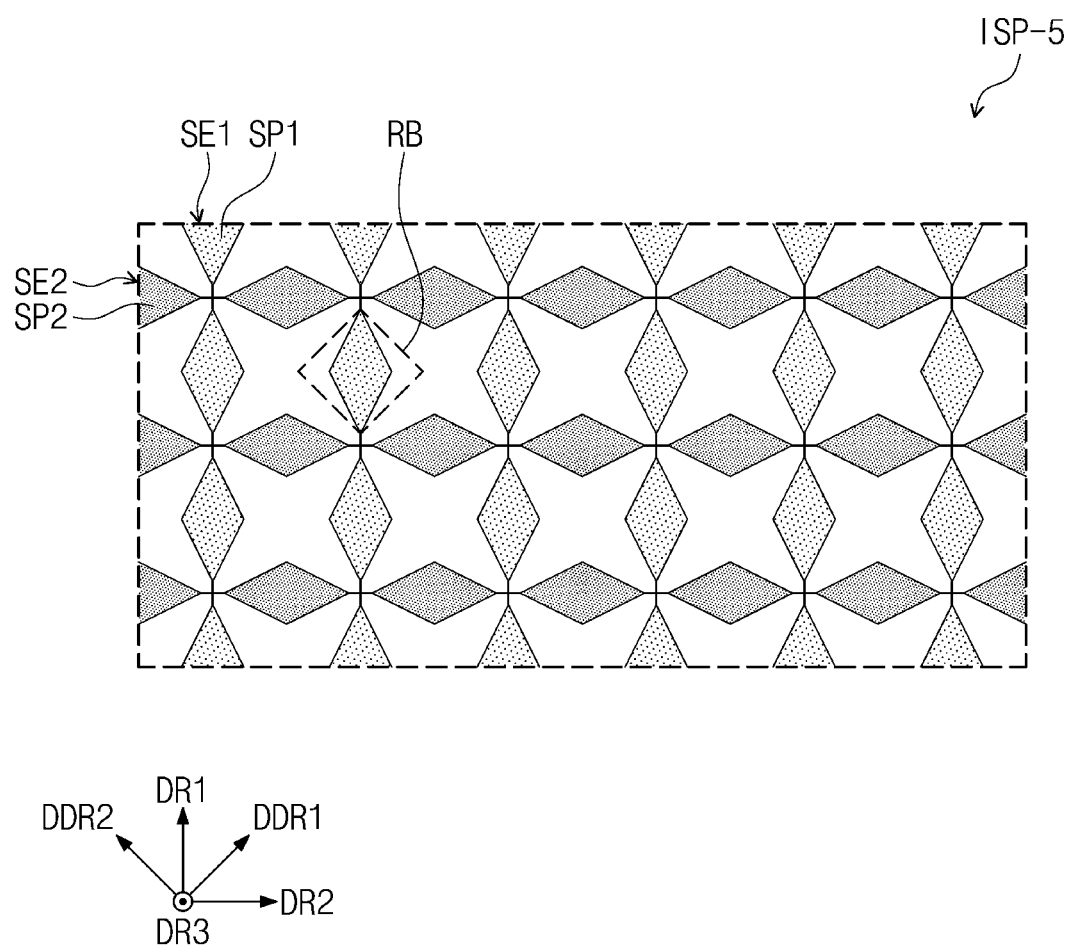
FIG. 28 is a plan view of a portion of an input sensing part according to an embodiment of the present disclosure.

FIG. 28 is a plan view of a portion of an input sensing part according to an embodiment of the present disclosure.

In an embodiment, FIG. 28 is a plan view that corresponds to FIG. 10. Below, a structure of an input sensing part ISP-5 illustrated in FIG. 28 will be described based on a difference with the input sensing part ISP illustrated in FIG. 10.

Referring to FIG. 28, in an embodiment, the input sensing part ISP-5 includes the first and second sensing electrodes SE1 and SE2, but does not include the dummy electrodes DME and the dummy lines DML illustrated in FIG. 10. The first sensing parts SP1 have a rhombus or diamond shape that extends longer in the first direction DR1 than in the second direction DR2. The second sensing parts SP2 have a rhombus or diamond shape that extends longer in the second direction DR2 than in the first direction DR1.

The first and second sensing parts SP1 and SP2 do not have a square rhombus shape RB illustrated by a dotted line in FIG. 28. The square rhombus shape RB has an interior angle that is a right angle. Accordingly, the rhombus shape RB has the same length in the first diagonal direction DDR1 and the second diagonal direction DDR2.

When viewed in a plan view, the area of each of the first and second sensing parts SP1 and SP2 is less than the area of the square rhombus shape RB. A capacitance of a capacitor is proportional to the area of a conductor. When each of the first and second sensing parts SP1 and SP2 has the square rhombus shape RB, the capacitance of the parasitic capacitor formed by the conductor of the display panel DP and the first and second sensing parts SP1 and SP2 increases. However, because the area of each of the first and second sensing parts SP1 and SP2 is less than the area of the square rhombus shape RB, the capacitance of the parasitic capacitor formed by the conductor of the display panel DP and the first and second sensing parts SP1 and SP2 decreases.

Figure 29:
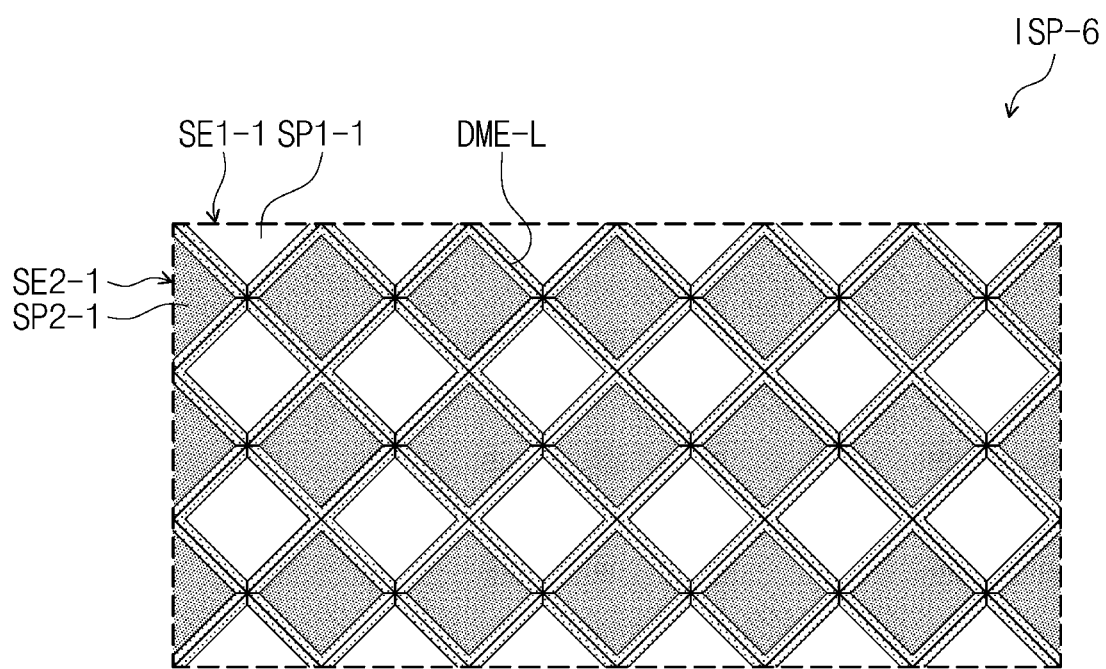
FIG. 29 is a plan view of a portion of an input sensing part according to an embodiment of the present disclosure.
Figure 29:
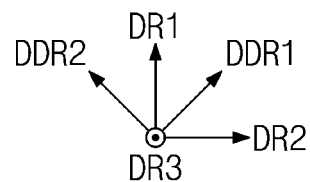

FIG. 29 is a plan view of a portion of an input sensing part according to an embodiment of the present disclosure.

In an embodiment, FIG. 29 is a plan view that corresponds to FIG. 10. Below, a structure of an input sensing part ISP-6 illustrated in FIG. 29 will be described based on a difference with the input sensing part ISP illustrated in FIG. 10.

Referring to FIGS. 29, in an embodiment, the input sensing part ISP-6 includes first and second sensing electrodes SE1-1 and SE2-1 and the dummy electrodes DME-L. First and second sensing parts SP1-1 and SP2-1 of the first and second sensing electrodes SE1-1 and SE2-1 have a square rhombus shape that have a right interior angle. The dummy electrodes DME-L extend in the first diagonal direction DDR1 and the second diagonal direction DDR2 in a line shape between the first and second sensing parts SP1-1 and SP2-1.

According to an embodiment of the present disclosure, dummy electrodes are disposed in dummy areas between first and second sensing electrodes, and an offset signal is applied to the dummy electrodes whose phase is opposite to a phase of a driving signal applied to the first sensing electrode. Accordingly, an electromagnetic signal occurring in an input sensing part is attenuated by the offset signal.

While embodiments of the present disclosure have been described with reference to the drawings, it will be apparent to those of ordinary skill in the art that various changes and modifications may be made thereto without departing from the spirit and scope of embodiments of the present disclosure as set forth in the following claims.

What is claimed is:

1. An input sensing part, comprising:
a first sensing electrode;
a second sensing electrode that is insulated from the first sensing electrode and crosses the first sensing electrode;
a plurality of dummy electrodes disposed in dummy areas located between the first and second sensing electrodes, when viewed in a plan view; and
a dummy connection pattern insulated from the first and second sensing electrodes,
wherein the dummy connection pattern crosses the first sensing electrode or the second sensing electrode, when viewed in a plan view, and connects the dummy electrodes.

2. The input sensing part of claim 1, further comprising:
a plurality of dummy lines that extend from the dummy electrodes and that are connected with the dummy connection pattern.

3. The input sensing part of claim 1, wherein the dummy connection pattern is disposed adjacent to a crossing of the first sensing electrode and the second sensing electrode.

4. The input sensing part of claim 1,
wherein the first sensing electrode includes:
a pair of first sensing parts arranged in a first direction; and
a connection pattern disposed between the first sensing parts that connects the first sensing parts, and
wherein the second sensing electrode includes:
a pair of second sensing parts arranged in a second direction that intersects the first direction; and
an extension pattern disposed between the second sensing parts and that extends from the second sensing parts and crosses the connection pattern.

5. The input sensing part of claim 4, wherein, when viewed in a plan view, the dummy connection pattern does not overlap the connection pattern and the extension pattern.

6. The input sensing part of claim 4,
wherein the first and second sensing parts and the extension pattern are disposed in the same layer, and the connection pattern is disposed in a different layer from the first and second sensing parts, and
wherein the dummy electrodes are disposed in the a same layer as the first and second sensing parts, and the dummy connection pattern is disposed in the same layer as the connection pattern.

7. The input sensing part of claim 4, wherein the dummy electrodes are connected in a first diagonal direction that intersects the first and second directions and in a second diagonal direction that intersects the first diagonal direction.

8. The input sensing part of claim 4, wherein the dummy connection pattern is adjacent to the connection pattern and the extension pattern, when viewed in a plan view.

9. The input sensing part of claim 4, wherein the dummy connection pattern crosses the first sensing parts and the second sensing parts, when viewed in a plan view.

10. The input sensing part of claim 4, wherein, when viewed in a plan view, the dummy connection pattern has a closed loop shape and surrounds the connection pattern and the extension pattern.

11. The input sensing part of claim 4,
wherein the first sensing electrode includes a plurality of first sensing electrodes,
wherein the second sensing electrode includes a plurality of the second sensing electrodes,
wherein the dummy connection pattern includes a plurality of the dummy connection patterns,
wherein the dummy electrodes are disposed between the first and second sensing parts and are connected by the plurality of dummy connection patterns,
wherein dummy electrodes that belong to a first group are connected, and
wherein dummy electrodes that belong to a second group are connected and are separated from the dummy electrodes of the first group.

12. The input sensing part of claim 4, wherein the first and second sensing parts and the dummy electrodes have a mesh shape.

13. The input sensing part of claim 4,
wherein the first and second sensing parts and the extension pattern are disposed in a same layer, and the connection pattern is disposed in a different layer from the first and second sensing parts, and
wherein the dummy electrodes and the dummy connection pattern are integrally formed and are disposed in the same layer as the connection pattern.

14. The input sensing part of claim 4,
wherein the dummy electrodes are connected in a first diagonal direction that intersects the first and second directions, and
wherein the dummy connection pattern crosses a pair of a first sensing part and a second sensing part that are adjacent to each other, when viewed in a plan view.

15. The input sensing part of claim 4,
wherein the dummy electrodes are connected in the first direction, and
wherein the dummy connection pattern crosses a corresponding second sensing part, when viewed in a plan view.

16. The input sensing part of claim 4,
wherein the first sensing electrode includes a plurality of first sensing electrodes,
wherein the second sensing electrode includes a plurality of second sensing electrodes,
wherein the dummy connection pattern includes a plurality of dummy connection patterns, and
wherein the dummy electrodes are disposed between the first and second sensing parts and are integrally connected by the plurality of dummy connection patterns.

17. The input sensing part of claim 4, wherein the dummy electrodes extend in a line shape in a first diagonal direction that intersects the first and second directions and in a second diagonal direction that intersects the first diagonal direction.

18. The input sensing part of claim 17, wherein each of the first and second sensing parts has a rhombus shape that extends longer in one of the first or second directions than in an other of the first or second directions.

19. An input sensing part, comprising:
a first sensing electrode;
a second sensing electrode that is insulated from the first sensing electrode and crosses the first sensing electrode; and
a plurality of dummy electrodes disposed in dummy areas located between the first and second sensing electrodes and that are connected with each other, when viewed in a plan view,
wherein a driving signal is applied to the first sensing electrode, and an offset signal is applied to the dummy electrodes, wherein a phase of the offset signal is opposite to a phase of the driving signal.

20. A display device, comprising:
a display panel; and
an input sensing part disposed on the display panel,
wherein the input sensing part includes:
a first sensing electrode;
a second sensing electrode that is insulated from the first sensing electrode and crosses the first sensing electrode;
a plurality of dummy electrodes disposed in dummy areas located between the first and second sensing electrodes, when viewed in a plan view; and
a dummy connection pattern insulated from the first and second sensing electrodes,
wherein the dummy connection pattern crosses the first sensing electrode or the second sensing electrode, when viewed in a plan view, and connects the dummy electrodes.

* * * * *